United States Patent
Bores

(10) Patent No.: US 10,850,279 B2
(45) Date of Patent: Dec. 1, 2020

(54) BOTTOM OPENING POD WITH MAGNETICALLY COUPLED CASSSETTES

(71) Applicant: ENTEGRIS, INC., Billerica, MA (US)

(72) Inventor: Gregory Bores, Prior Lake, MN (US)

(73) Assignee: ENTEGRIS, INC., Billerica, MA (US)

( * ) Notice: Subject to any disclaimer, the term of this patent is extended or adjusted under 35 U.S.C. 154(b) by 421 days.

(21) Appl. No.: 15/561,226

(22) PCT Filed: Mar. 27, 2016

(86) PCT No.: PCT/US2016/024394
§ 371 (c)(1),
(2) Date: Sep. 25, 2017

(87) PCT Pub. No.: WO2016/160636
PCT Pub. Date: Oct. 6, 2016

(65) Prior Publication Data
US 2018/0056291 A1 Mar. 1, 2018

Related U.S. Application Data

(60) Provisional application No. 62/139,269, filed on Mar. 27, 2015.

(51) Int. Cl.
*B01L 9/00* (2006.01)
*B01L 3/00* (2006.01)
(Continued)

(52) U.S. Cl.
CPC .............. *B01L 3/50853* (2013.01); *B01L 9/52* (2013.01); *H01L 21/67373* (2013.01); *B01L 2200/025* (2013.01); *B01L 2200/141* (2013.01); *B01L 2300/041* (2013.01); *G01N 2035/0465* (2013.01)

(58) Field of Classification Search
CPC ................. B01L 9/52; B01L 2200/025; G01N 2035/0465
See application file for complete search history.

(56) References Cited

U.S. PATENT DOCUMENTS

| 4,995,430 A | 2/1991 | Bonora et al. |
| 5,713,711 A | 2/1998 | McKenna et al. |
| (Continued) | | |

FOREIGN PATENT DOCUMENTS

| DE | 102007009219 A1 | 8/2008 |
| JP | H06-132391 A | 5/1994 |
| (Continued) | | |

OTHER PUBLICATIONS

"Align Polymagnets" Retrieved from the Internet URL: http://www.amazingmagnets.com/c-160-aling-polymagnets.aspx, on Mar. 14, 2016, pp. 1-2.

*Primary Examiner* — Jill A Warden
*Assistant Examiner* — Dwayne K Handy
(74) *Attorney, Agent, or Firm* — Entegris, Inc.

(57) ABSTRACT

A bottom opening pod utilizing magnetic coupling for securing one or more cassettes within. The pod includes magnetic couplers that provide magnetic coupling between the cassette(s) and the bottom door of the pod. The magnetic couplers may include magnetic elements disposed on a base of the cassette and on the bottom door of the pod. The magnetic coupling secures the cassette(s) to the bottom door without imposition of separation forces between the housing and the bottom door of the pod.

16 Claims, 13 Drawing Sheets

(51) Int. Cl.
*H01L 21/673* (2006.01)
*G01N 35/04* (2006.01)

(56) References Cited

U.S. PATENT DOCUMENTS

| | | | |
|---|---|---|---|
| 6,432,849 | B1 | 8/2002 | Endo et al. |
| 8,395,467 | B2 | 3/2013 | Fullerton et al. |
| 2007/0175792 | A1 | 8/2007 | Gregerson |
| 2015/0041359 | A1 | 2/2015 | Tieben et al. |
| 2018/0362910 | A1 | 12/2018 | Bores et al. |

FOREIGN PATENT DOCUMENTS

| | | |
|---|---|---|
| JP | H07-315477 A | 12/1995 |
| JP | H09-148423 A | 6/1997 |
| JP | 2000-106393 A | 4/2000 |
| JP | 2004140278 A | 5/2004 |
| TW | 201302568 A | 1/2013 |
| WO | 97/03222 A1 | 1/1997 |
| WO | 2016/160636 A1 | 10/2016 |

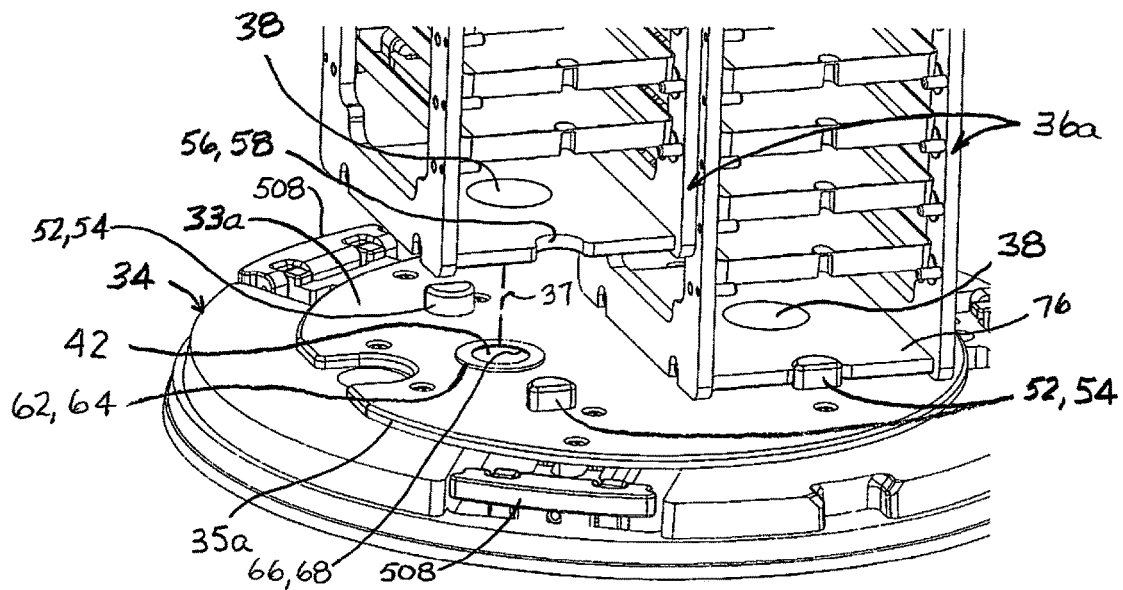
FIG. 2
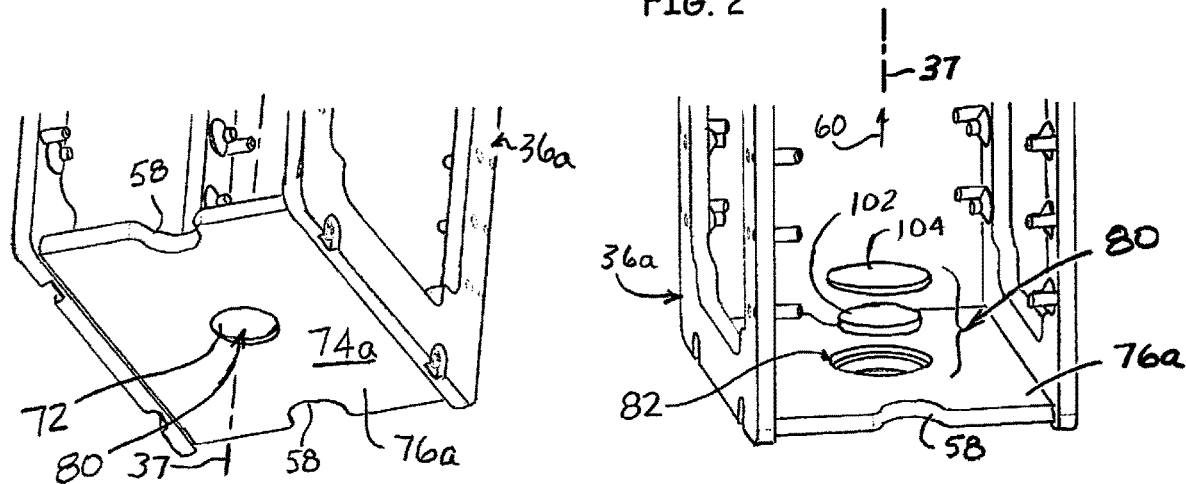
FIG. 3
FIG. 4
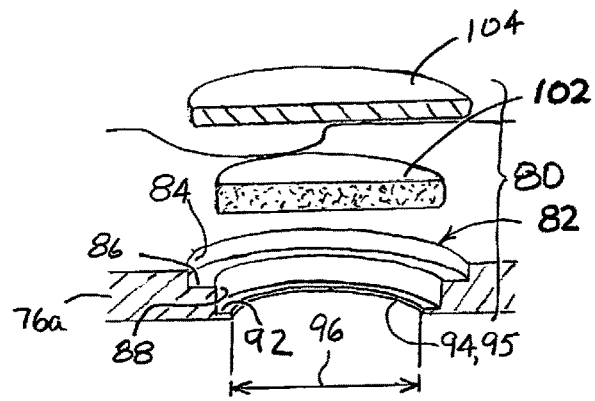
FIG. 5

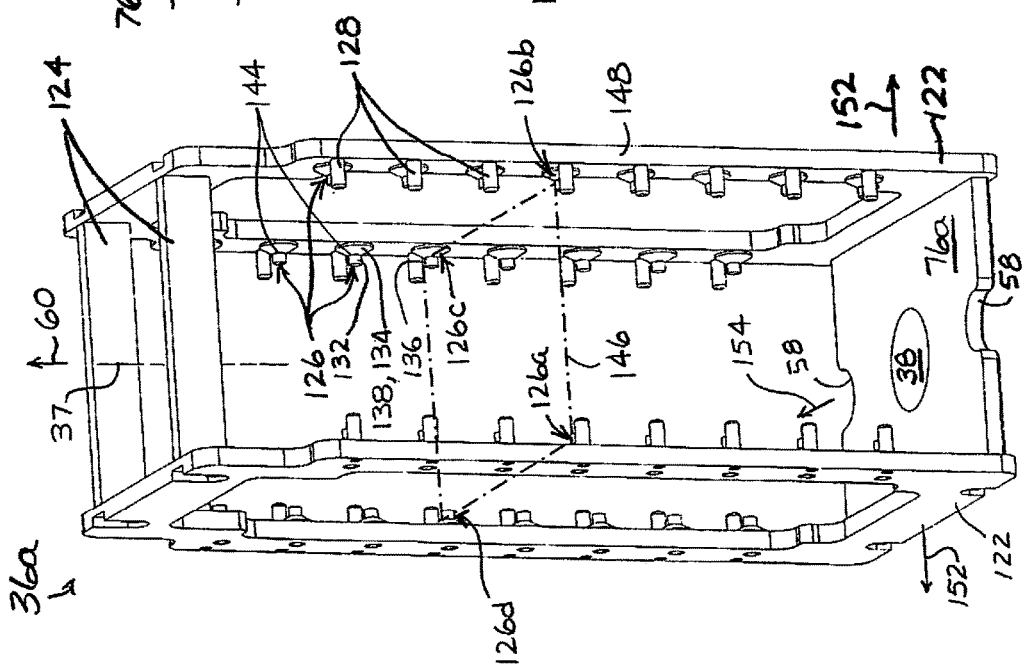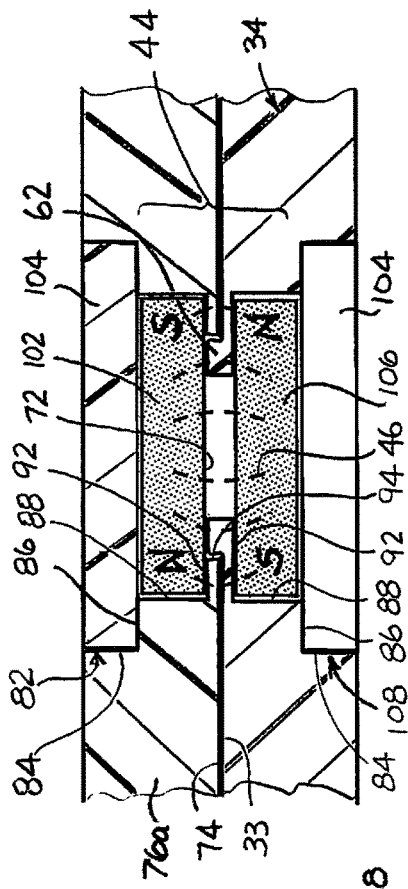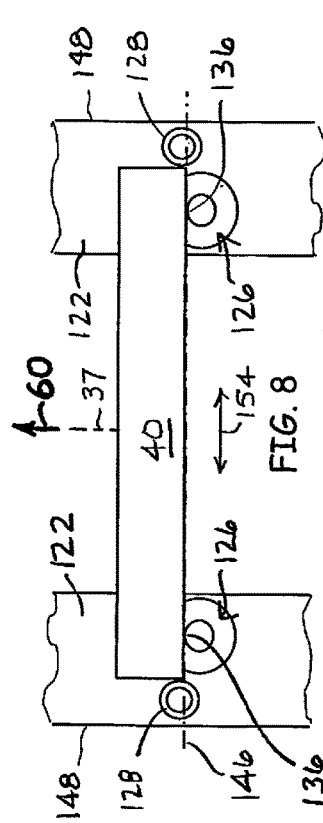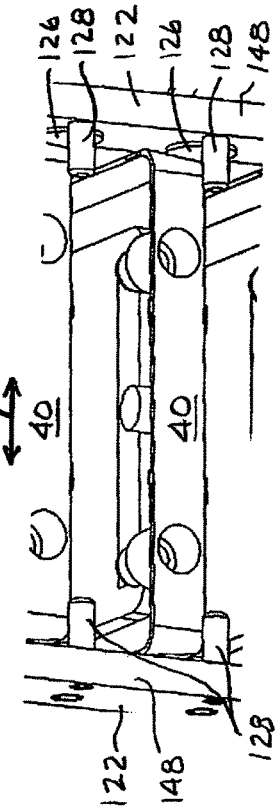

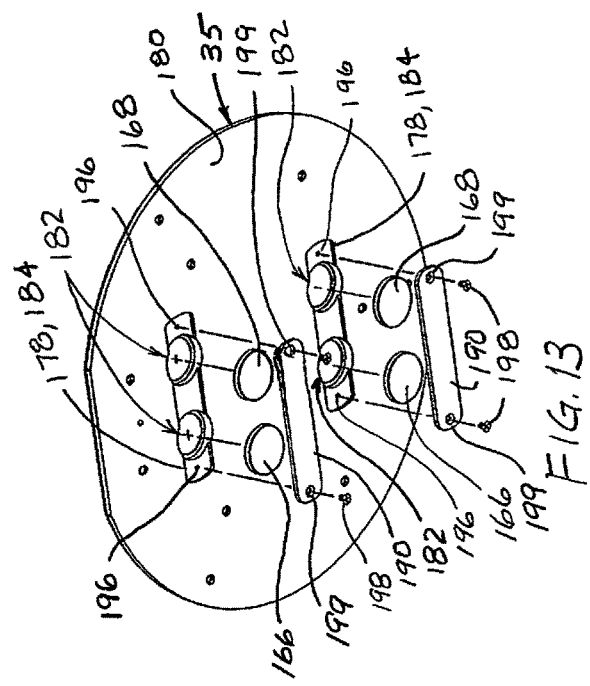
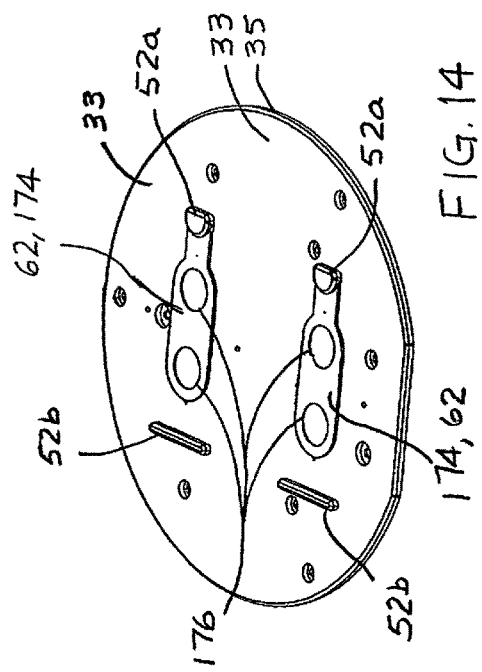
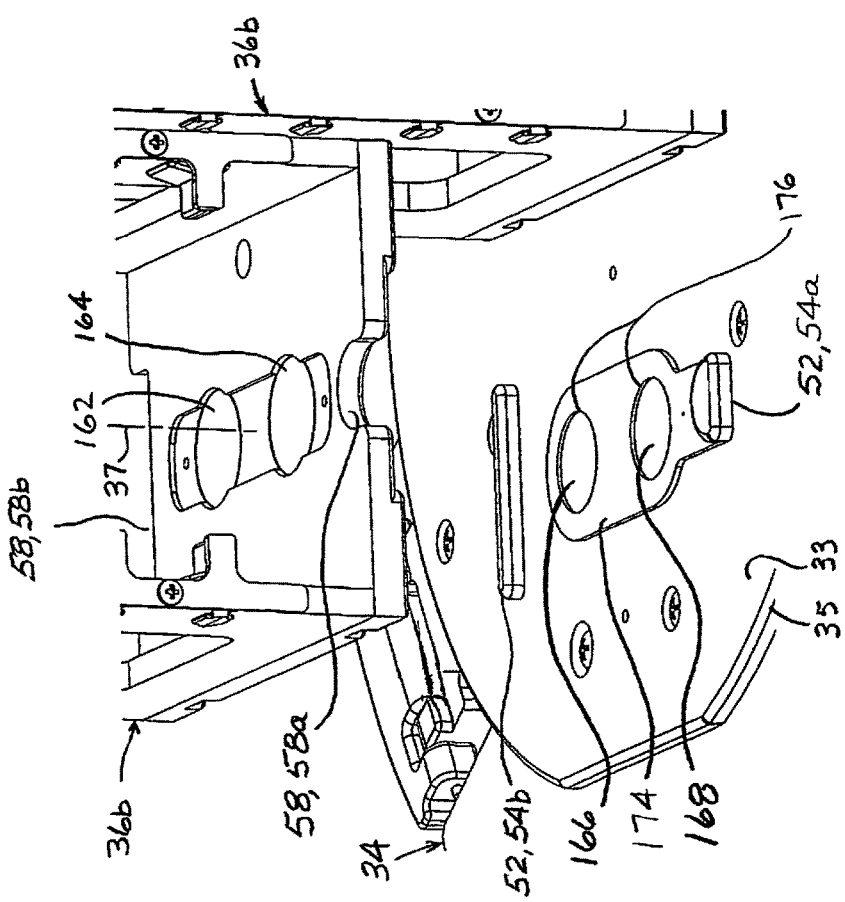

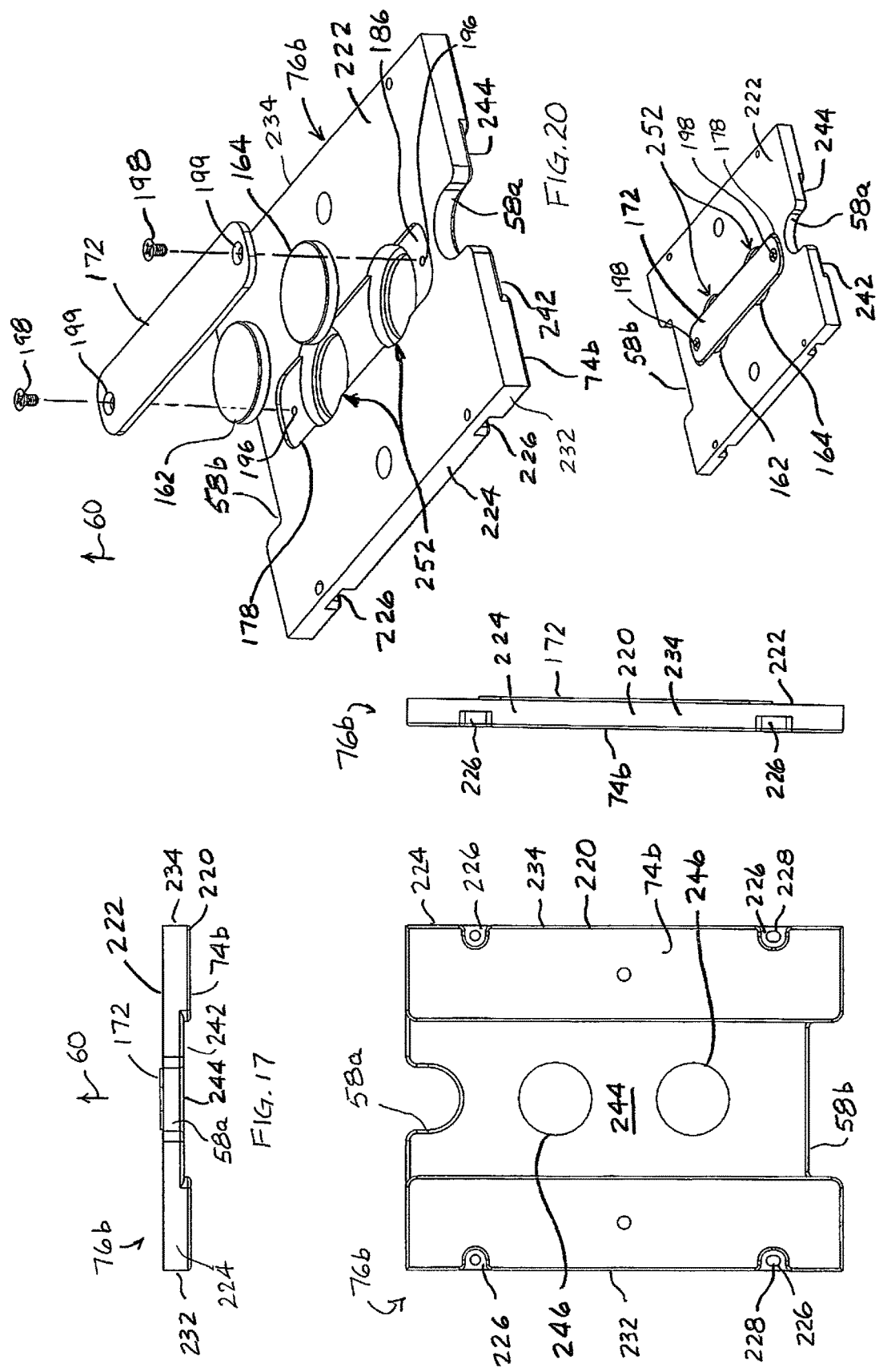

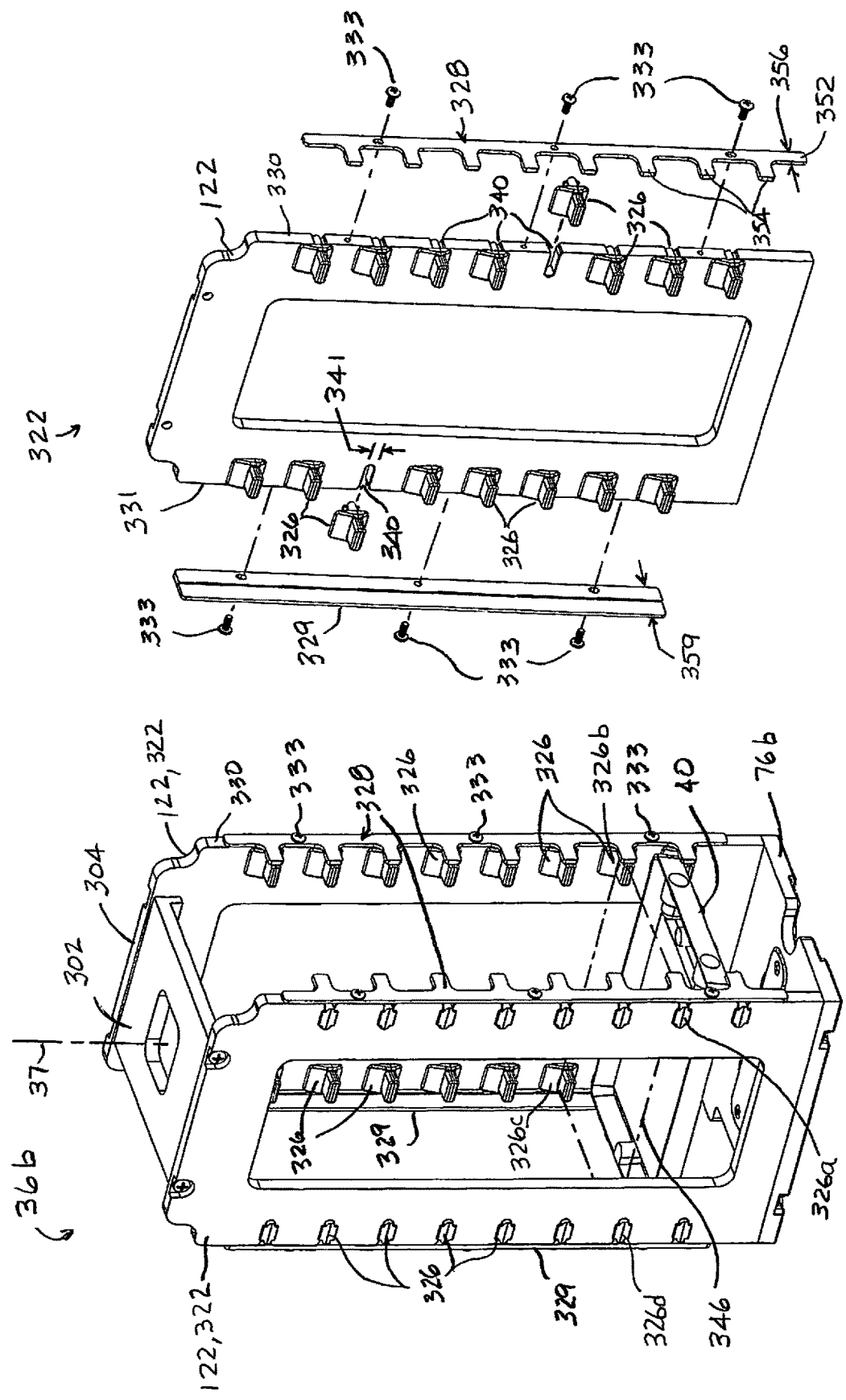

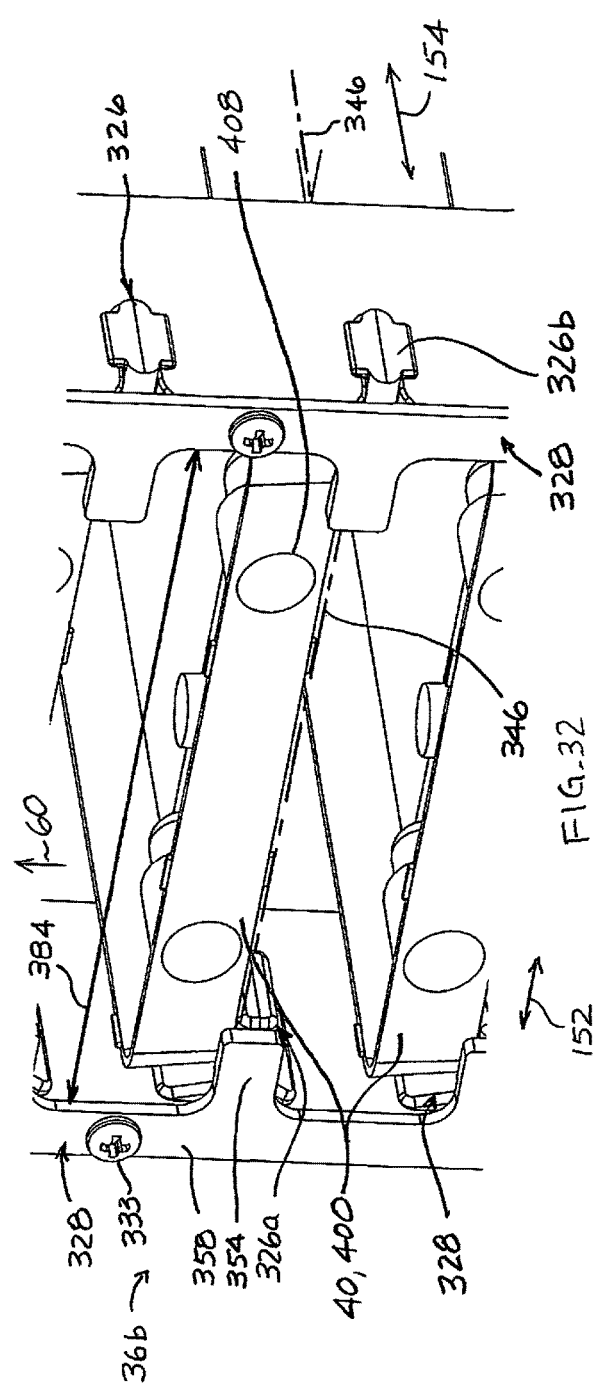
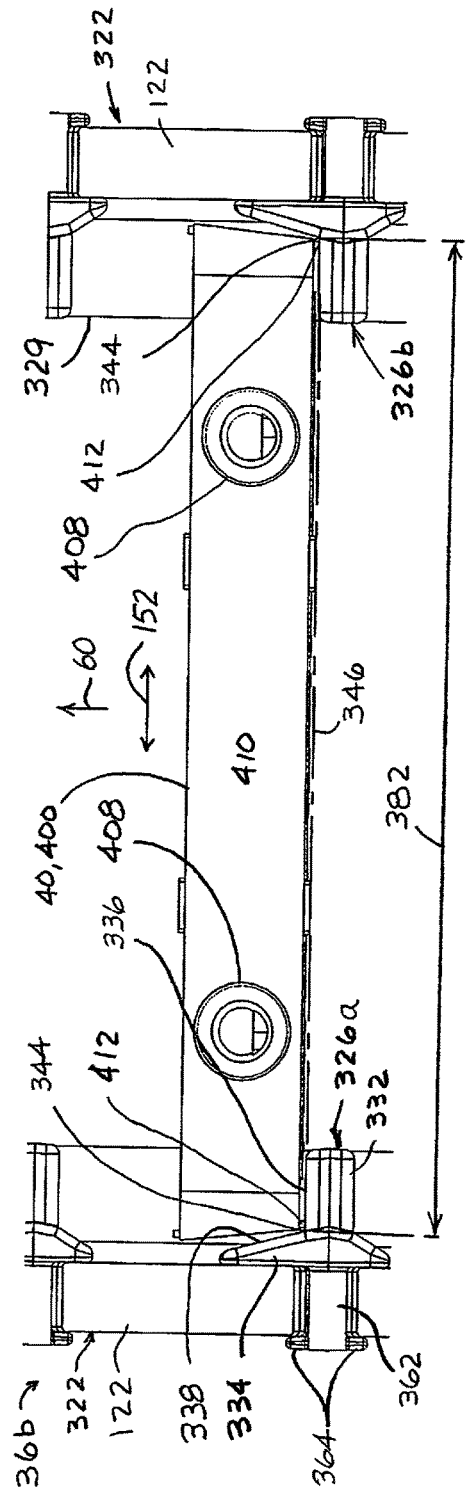

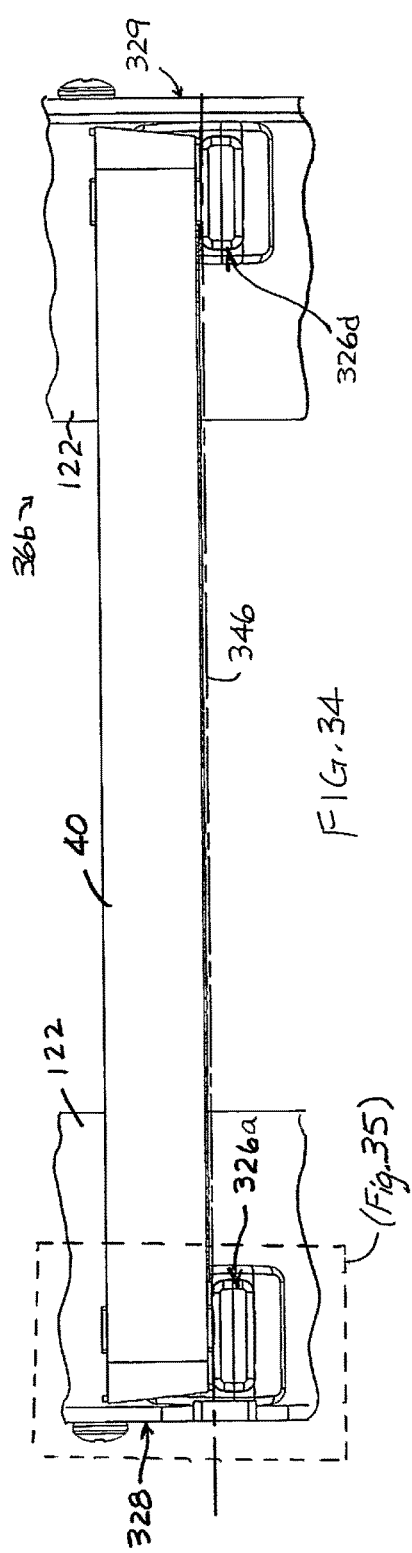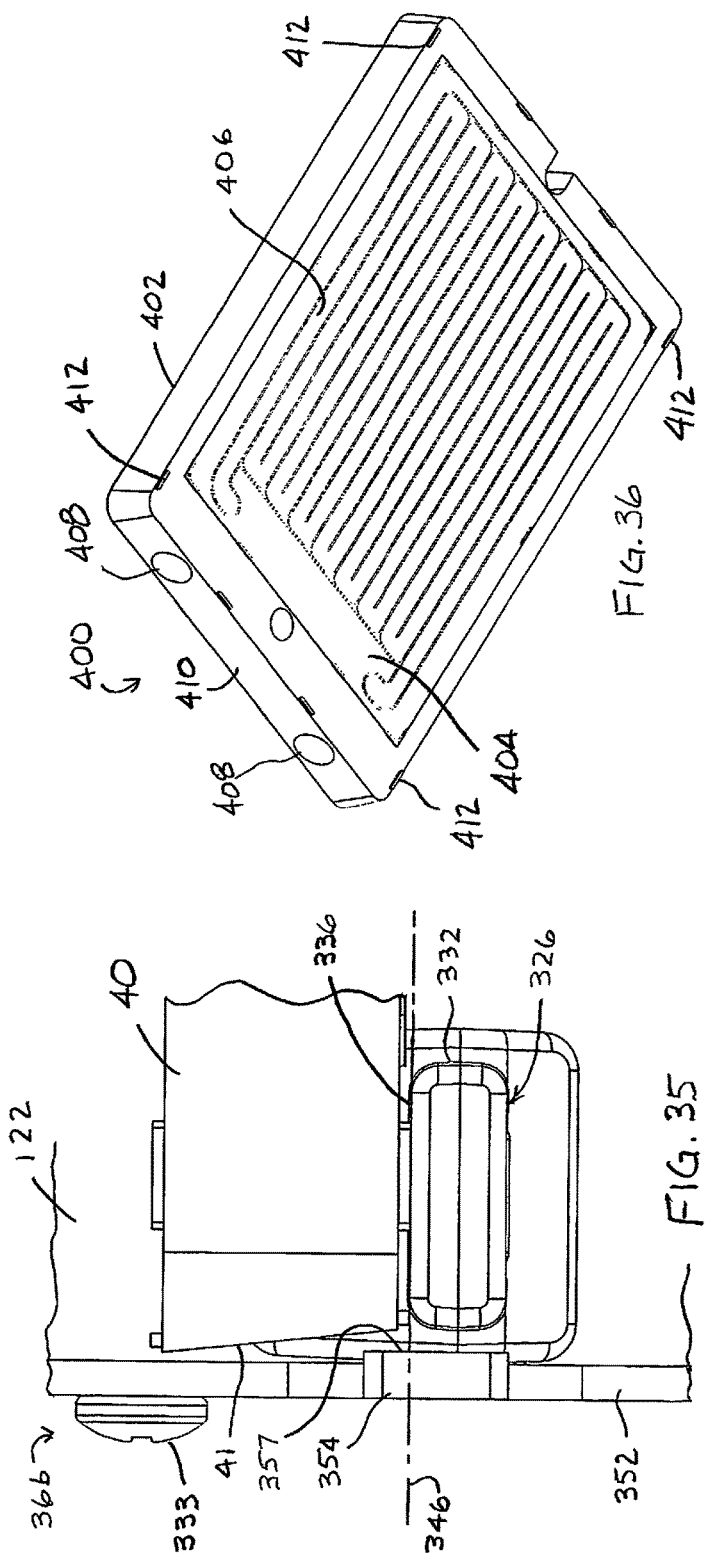

BOTTOM OPENING POD WITH MAGNETICALLY COUPLED CASSSETTES

RELATED APPLICATIONS

This application claims the benefit of U.S. Provisional Patent Application No. 62/139,269, filed Mar. 27, 2015, the disclosure of which is incorporated by reference herein in its entirety.

FIELD OF THE DISCLOSURE

The field of the disclosure relates generally to bottom opening pods, and more specifically to bottom opening pods that retain cassettes therein by magnetic coupling.

BACKGROUND

Conventional systems and methods for handling and processing biological samples are labor intensive. Sample trays are transported, handled, and processed by human operators. Throughput and efficiency of the process is limited by the capacity of the human operators. The extensive human interaction can also cause the processing of biological samples to be prone to microorganism contamination. In some instances, the handling of the biological samples can also present health risks to the operating personnel.

What is needed is a way to reduce the extensive amount of human interaction in the processing of biological testing.

SUMMARY

In various embodiments, a bottom opening pod is disclosed that utilizes magnetic coupling for securing one or more cassettes mounted within. The bottom opening pod includes magnetic couplers that provide magnetic coupling between the cassette(s) and the bottom door of the pod. In one embodiment, the magnetic couplers include magnetic elements disposed on a base of the cassette and on the bottom door of the pod.

Conventional bottom opening pods, such as Standard Mechanical Interface (SMIF) pods utilized in the semiconductor industry, present a promising platform for the automation of biological handling and processing. SMIF pods typically include a housing and a bottom door upon which cassettes that house wafer substrates is mounted, and are used for conveyance of semiconductor substrates through automated (robotic) manufacturing processes. SMIF pods have evolved with attention to concerns of semiconductor manufacturing, such as preventing particle generation and maintaining a purged microenvironment to control contamination. Many of these attributes lend themselves to favorable treatment and handling of biological testing.

Nevertheless, the SMIF pods used in semiconductor processing would benefit from modifications for adaptation to biological testing. While particle generation is of tantamount concern in semiconductor processing, the watchwords for biological testing are sterility and asepsis. That is, where semiconductor processing is concerned with prevention and removal of particulates and minimizing oxidation effects, biological testing focuses on maintaining a sterile environment. Accordingly, purge systems have different requirements in a biological testing context than in semiconductor processing context. Where purging with high purity nitrogen is a mechanism for preventing contamination in SMIF pods for semiconductor processes, aseptic gases such as hydrogen peroxide may be used in sterilization processes for biological testing. Accordingly, for some biological testing applications that utilize certain aseptic gases for sterilization, SMIF pods must be compatible with those aseptic gases.

The quest for modifying SMIF pods for biological testing processes has also yielded improvements that may be implemented in the semiconductor context as well. Conventional SMIF pods often utilize a gasket or seal member that is generally rectangular in shape, with rounded regions at the corners. Such rectangular seal members evolved from containers that generally conform to the rectangular shape of the cassettes housed within the SMIF pods. Rectangular seal members may be prone to leaks or undue stresses at the corners. One improvement of the current disclosure is to utilize circular seals, which may provide a more reliable seal.

Consider also that conventional SMIF pods often utilize spring mechanisms disposed between the cassettes and the top of the housing to retain the cassettes in place, thereby exerting a downward force that secures the cassettes on the mounting face of the bottom door. One disadvantage to this conventional approach is that the retention force also manifests itself as a separation force that works against the closure provided by the bottom door. That is, the springs not only provide a downward force against the doors via the cassettes, but also exerts an upward force against the housing. Thus, the springs effectively try to lift or separate the housing from the bottom door, which can breach the closure or seal between the housing and the bottom door and lead to contamination. The spring loaded arrangement also exerts stresses on the cassettes, which can cause distortions in the cassette structure with adverse effects. Another disadvantage is that the retention forces exist only when the housing is coupled to the bottom door. Accordingly, when the housing is removed from the bottom door, there are no forces retaining the cassettes in place other that the weight of the cassettes themselves.

Thus, in many instances, modifications and improvements developed and disclosed herein for the purpose of biological testing processes can have application for semiconductor processes. One example of a modification that has utility in both biological testing and semiconductor fabrication processes is the use of magnetic coupling between the cassettes and the bottom door. In various embodiments of the magnetic coupling arrangement disclosed herein, the cassette(s) are secured to the bottom door without imposition of separation or lift force on the housing of the pod, so as not to impose forces that oppose the closure and seal. The magnetic coupling also continues to act when the housing is removed, thereby providing better security of the cassettes and their cargo during a handling mishap, such as, for example, a robotic malfunction. Also, the magnetic coupling does not exert a force on the greater structure of the cassette; rather, the only force experienced by the cassette is compression at the interface of the bottom door and the bottom or mounting face of the cassette.

Structurally, in various embodiments of the disclosure, a bottom opening pod is disclosed, including a bottom door, a housing that cooperates with the bottom door to define an interior chamber, a first cassette disposed in the interior chamber and mounted to the bottom door, and a first magnetic coupler adapted to magnetically couple the first cassette to the bottom door. In some embodiments, a circular seal member is disposed between the housing and the bottom door. The first magnetic coupler may include a permanent magnet, and may further include a first permanent magnet mounted on the first cassette and a second permanent magnet mounted on the bottom door. In some embodiments, the first permanent magnet biases the first cassette toward an orientation that is centered with the second permanent magnet.

In some embodiments, the first permanent magnet and the second permanent magnet are coded magnets configured for centering with each other. The coded magnets may be magnetically keyed for biasing the cassette in a preferred rotational orientation with respect to the bottom door. The first cassette and the bottom door may also include complementary mating structures for rotational alignment of the first cassette on the bottom door. In some embodiments, complimentary mating structures are configured to align the first cassette in a single rotational orientation. In various embodiment, the bottom opening pod includes a second cassette and a second magnetic coupler for magnetically coupling the second cassette to the bottom door.

In various embodiments of the disclosure, the bottom opening pod includes a second magnetic coupler adapted to magnetically couple the first cassette to the bottom door. The second magnetic coupler may include a permanent magnet. In some embodiments, the first magnetic coupler includes a first permanent magnet mounted on the first cassette and a second permanent magnet mounted on the bottom door, with the second magnetic coupler including a third permanent magnet mounted on the first cassette and a fourth permanent magnet mounted on the bottom door. In certain embodiments, the first permanent magnet and the second permanent magnet cooperate with and the third permanent magnet and the fourth permanent magnet to bias the first cassette toward a rotational alignment with respect to the bottom door. The first permanent magnet and the second permanent magnet may be coded magnets configured to center with each other. The third permanent magnet and the fourth permanent magnet also may be coded magnets configured to center with each other. In some embodiments, the coded magnets are magnetically keyed for biasing the first cassette in a preferred rotational orientation with respect to the bottom door. In various embodiments, a coupling face of the first permanent magnet is configured to repel a coupling face of the third permanent magnet, such that a repulsion force is generated between the first cassette and the bottom door when the first permanent magnet is aligned with the third permanent magnet. Also, a coupling face of the second permanent magnet may be configured to repel a coupling face of the fourth permanent magnet, such that a repulsion force is generated between the first cassette and the bottom door when the second permanent magnet is aligned with the fourth permanent magnet. The repulsion forces help prevent misalignment of the cassette(s) relative to the bottom door.

In various embodiments, the first cassette and the bottom door include complementary mating structures for rotational alignment of the first cassette on the bottom door, and the second cassette and the bottom door include complementary mating structures for rotational alignment of the second cassette on the bottom door. The complimentary mating structures may be configured to align the first cassette in a single rotational orientation and to align the second cassette in a single rotational orientation.

In various embodiments of the disclosure, a method for robotically removing a stored item from a cassette is disclosed. The method includes engaging the stored item with an end effector of a robotic manipulator; with the end effector, elevating the stored item upward and away from mounting features of the cassette so that the stored item is elevated higher than retention features of the cassette; and translating the stored item over the retention features and out of the cassette.

Similarly, a method for robotically inserting a stored item into a cassette is disclosed, including: engaging the stored item with an end effector of a robotic manipulator; with the end effector, elevating the stored item so that the stored item is elevated higher than retention features of the cassette; translating the stored item over the retention features and into the cassette; and lowering the stored item onto mounting features of the cassette. For either method, the end effector may be coupled to a receptacle defined on the stored item. The stored item may be a biological sample tray.

BRIEF DESCRIPTION OF THE DRAWINGS

FIG. 2 is a partial perspective view of the cassettes and a bottom door of a bottom opening pod, with one cassette decoupled from the bottom door according to an embodiment of the disclosure.

FIG. 3 is a partial bottom perspective view of a cassette according to an embodiment of the disclosure.

FIG. 4 is an exploded, perspective view of a permanent magnet assembly according to an embodiment of the disclosure.

FIG. 5 is an enlarged sectional view of the permanent magnet assembly of FIG. 4.

FIG. 6 is a sectional view of a magnetic coupler according to an embodiment of the disclosure.

FIG. 7 is a front perspective view of a cassette according to an embodiment of the disclosure.

FIG. 8 is a side view of mounting and retention features of FIG. 7 with a stored item mounted thereto according to an embodiment of the disclosure.

FIG. 9 is a partial front perspective view of stored items mounted in the cassette of FIG. 8 according to an embodiment of the disclosure.

FIG. 12 is an enlarged, partial perspective view of FIG. 11.

FIG. 13 is an exploded, bottom perspective view of a door cover plate of FIG. 11 according to an embodiment of the disclosure.

FIG. 14 is a top perspective view of the door cover plate of FIG. 13 according to an embodiment of the disclosure.

FIG. 17 is a front elevational view of a base plate of a cassette of FIG. 11 according to an embodiment of the disclosure.

FIG. 18 is a bottom plan view of the base plate of the cassette of FIG. 11 according to an embodiment of the disclosure.

FIG. 19 is a side view of the base plate of the cassette of FIG. 11 according to an embodiment of the disclosure.

FIG. 20 is an exploded, perspective view of the base plate assembly of the cassette of FIG. 11 according to an embodiment of the disclosure.

FIG. 21 is a perspective view of the base plate assembly of FIG. 20 according to an embodiment of the disclosure.

FIG. 26 is a perspective view of a cassette of FIG. 10 according to an embodiment of the disclosure.

FIG. 27 is a partially exploded view of a side frame of the cassette of FIG. 26.

FIG. 32 is an enlarged, partial perspective view of the loaded cassette of FIG. 10 according to an embodiment of the disclosure.

FIG. 33 is a front elevational view of a tray mounted to a cassette of FIG. 10 with the forward retention rails removed according to an embodiment of the disclosure.

FIG. 34 is a side elevational view of the tray mounted to the cassette of FIG. 33 according to an embodiment of the disclosure.

FIG. 35 is an enlarged, partial view of FIG. 34.

FIG. 36 is a bottom perspective view of a tray use in embodiments of the disclosure.

DETAILED DESCRIPTION OF THE DEPICTED EMBODIMENTS

Figures 1A, 1B:
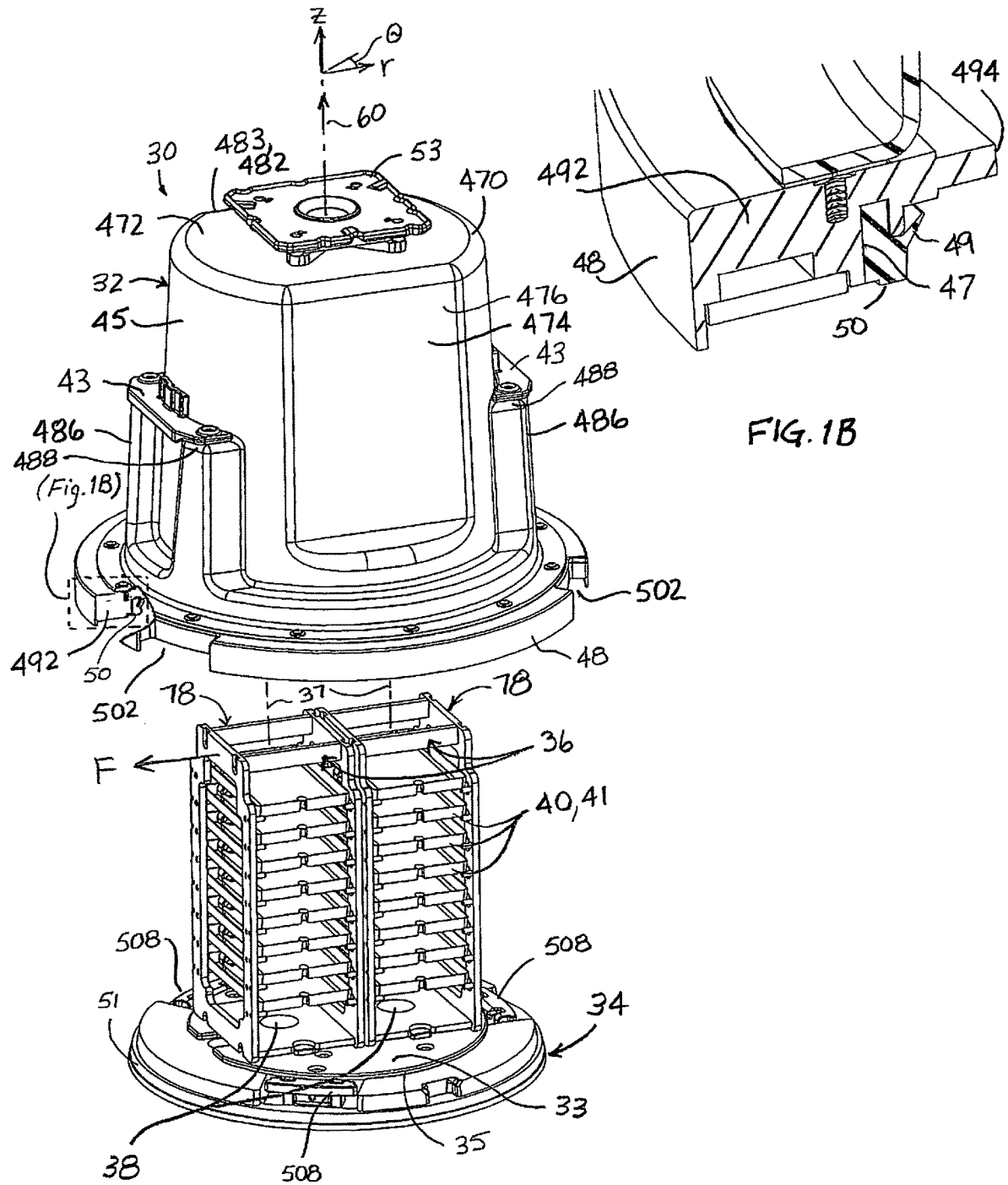
FIG. 1A is a perspective, partial cutaway view of a disassembled bottom opening pod with loaded cassettes mounted thereto according to an embodiment of the disclosure.
FIG. 1B is an enlarged view of a cutaway portion of FIG. 1A according to an embodiment of the disclosure.
Figure 1C:
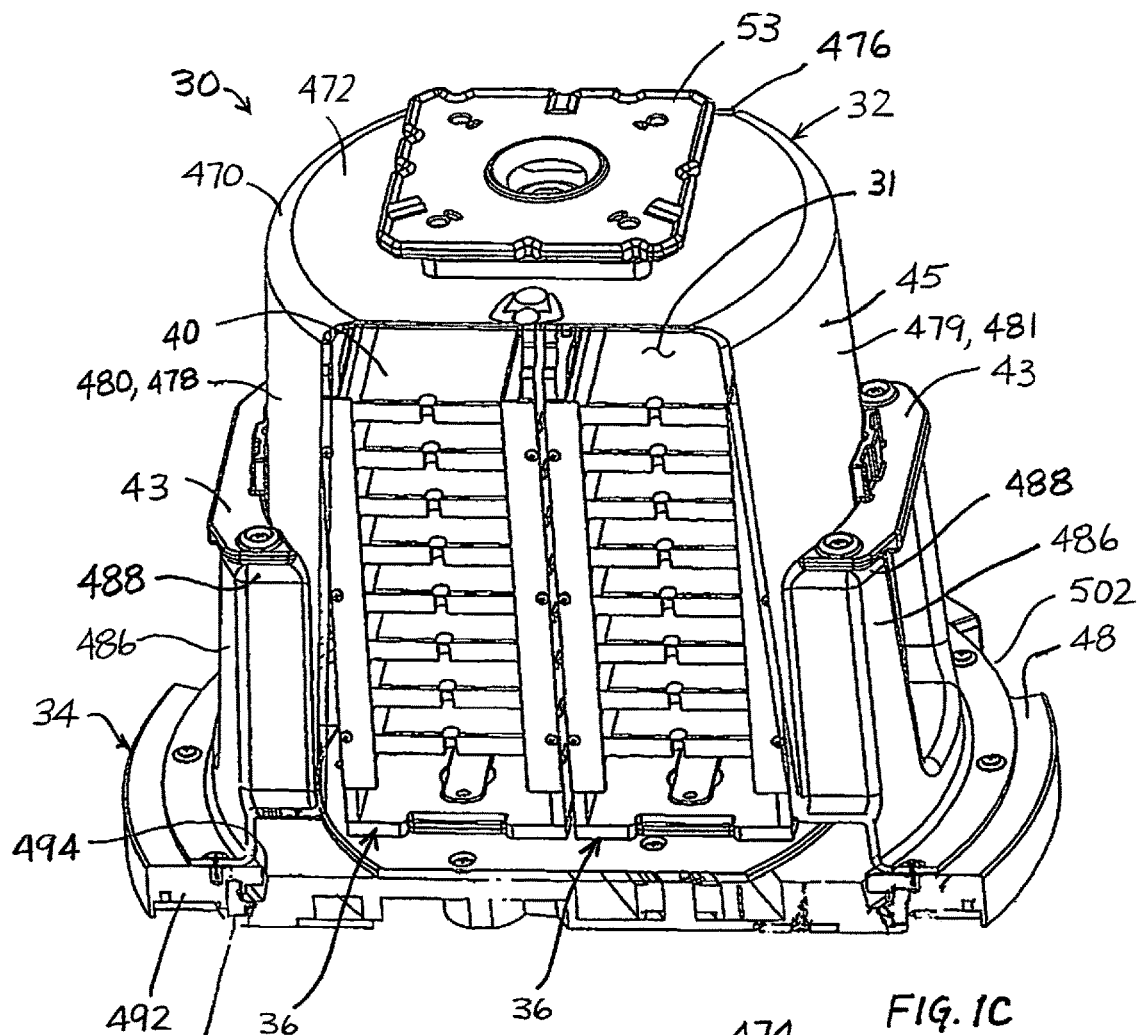
FIG. 1C is a rear perspective, cut away view of the assembled bottom opening pod of FIG. 1A revealing cassettes and a latching mechanism according to an embodiment of the disclosure.

Referring to FIGS. 1A through 1D, a bottom opening pod 30 is depicted according to an embodiment of the disclosure. The bottom opening pod 30 includes a housing 32 and a bottom door 34 which cooperate to define an enclosed chamber 31. A pair of cassettes 36 are coupled to a cover plate 35 of the bottom door 34 of the bottom opening pod 30, the cover plate 35 including a mounting face 33. The cassettes 36 each define a central axis 37. In some embodiments, the cassettes 36 each include a magnetic coupling element 38 for magnetically coupling the cassettes 36 to the bottom door 34. Each cassette 36 is configured for storage of a plurality of stored elements 40, each including a forward face 41. The stored elements 40 can be any of a variety of items. Typically, the stored elements 40 are robotically handled items, such as trays (e.g. life culture trays) or semiconductor substrates, but can generally be any stored component or device conducive to mounting in a cassette.

In various embodiments, the housing 32 includes a shell portion 45 extending from a circular flange 48 that surrounds the bottom door 34. A circular seal member 50 is coupled to an interior perimeter 47 of the circular flange 48. The circular seal member 50 may include a lip portion 49 that engages a circular lateral face 51 of the bottom door 35 to provide an air-tight seal between the housing 32 and the bottom door 34. In various embodiments, the circular seal member 50 defines a V-shaped or a Y-shaped cross-section. Functionally, the circular sealing arrangement typically provides a more reliable seal than, for example, a substantially square or rectangular sealing arrangement.

In various embodiments, the materials of construction of the bottom opening pod 30 include polyethylene terephthalate glycol (PETG), acrylonitrile butadiene styrene (ABS), and 3D printed polycarbonate. In certain embodiments, the bottom opening pod 30 is configured to for compatibility with an aseptic sterilization gas such as hydrogen peroxide. Materials of construction that are compatible with hydrogen peroxide include aluminum, polypropylene, and high density polyethylene (HDPE).

In various embodiments, the housing 32 includes a pair of manual handles 43, and a robotic flange 53. In some embodiments, the shell portion 45 may be separately formed from the circular flange 48 and the components assembled together using fasteners. Similarly, the robotic flange 53 and handles 43 may be attached with fasteners to the shell portion 45. In other embodiments, the shell portion 45 and circular flange 48 may be unitary with the handles and robotic flange attached thereto. In some embodiments the shell, base, handles, and robotic flange are all be formed unitarily such as by injection molding.

The housing 32 generally has a closed top 470 with a top wall 472, a closed forward side 474, a flat forward wall 476, closed sides 478, 479, arcuate side walls 480, 481, closed back side 482, and a flat back wall 483. Outwardly protruding structures 486 provide attachment structure with shoulders 488 for attaching the manual handles 43. The circular flange 48 of the housing 32 provides a door frame 492 and door opening 494. The bottom door 34 may have arcuate plates 495 of steel or other ferrous-containing material that serves as an armature 496 for attraction to the electromagnets in the load port door. Proximity of the circular armature 496 to the circular seal member 50 may facilitate security and tightness of the bottom door 34. A discussion of the function of the circular armature 496 is found at U.S. Provisional Patent Application No. 62/175,823, commonly owned by the applicant of the present application, the disclosure of which is incorporated by reference herein in its entirety except for express definitions and patent claims contained therein.

Figure 1D:
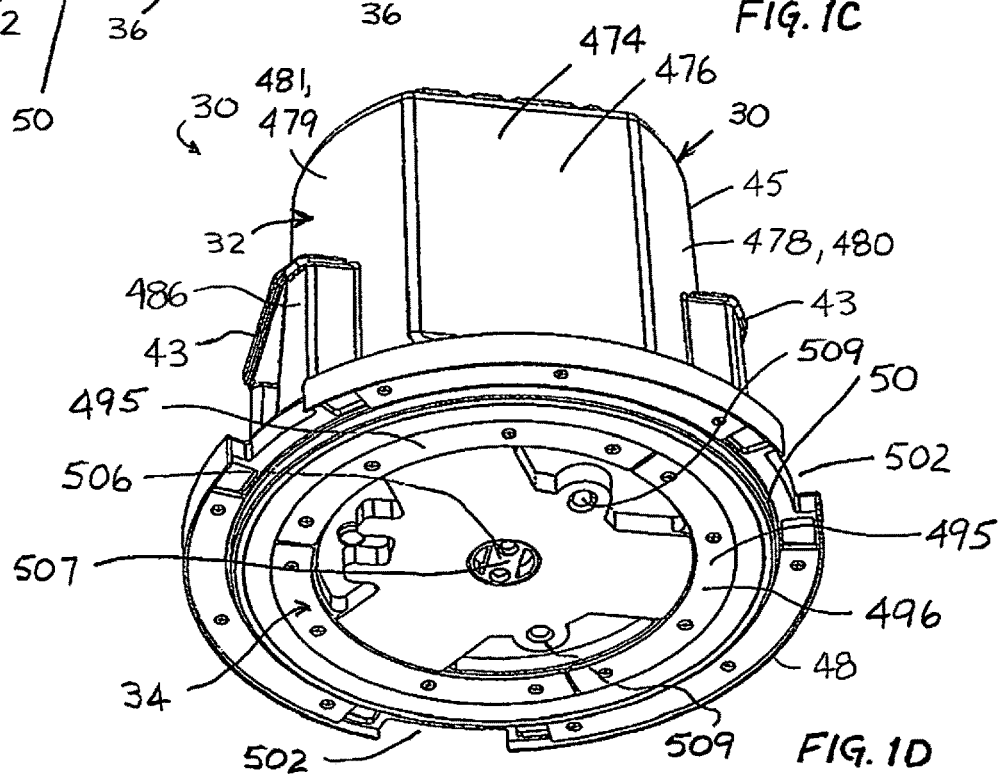
FIG. 1D is a bottom perspective view of the assembled bottom opening pod of FIG. 1A according to an embodiment of the disclosure.

As depicted in FIG. 1D, the bottom door 34 may include a latch mechanism 506 with three latching members 508 that extend from the periphery of the bottom door 34 to latch onto the door frame 492, securing the bottom door 34 therein. The latch mechanism 506 may include a robotic handle 507 for interfacing with automation. The bottom door 34 may have structure defining pin recesses or openings 509 that cooperate with structure on the load port door for proper alignment between said load port and bottom door 34. The circular flange 48 may define outer peripheral notches or openings 502 that correspond to projections on the load port for facilitating proper alignment of the bottom opening pod 30 with the load port.

Referring to FIG. 2, the bottom door 34 is depicted with the cassettes 36 according to an embodiment of the disclosure. The bottom door 34 includes a magnetic coupling element 42 that magnetically couples with the magnetic coupling element 38. When either of the magnetic coupling elements 38 or 42 of the cassette 36 or bottom door 34, respectively, are magnetically coupled with the bottom door 34 or the cassette 36, respectively, a magnetic coupler 44 that generates a magnetic coupling 46 (FIG. 6) is defined. That is, the magnetic coupler 44 may include, for example, the magnetic coupling element 38 of the cassette 36 magnetically coupled to the magnetic coupling element 42 of the bottom door 34, as depicted in FIG. 2. More generally, the magnetic coupler 44 includes elements that on each of bottom door 34 and the cassette 36 that are magnetically coupled when in close proximity to each other. Therefore, in some embodiments, one of the magnetic coupling elements 38 or 42 includes a magnetic material, such as iron or steel, while the other comprises a magnetized material such as a permanent magnet. In other embodiments, both the magnetic coupling elements 38 and 42 include a magnetized material.

Alternatively, one of the bottom door 34 and the cassette 36 is made of a magnetic material, or includes a magnetic layer, with the complementary magnetic coupling element 36 or 42 including a magnetized material. In these embodiments, the magnetic coupler 44 generates the magnetic coupling 46 between the (magnetized) coupling element 38 or 42 and the (magnetic) bottom door 34 or cassette 36 to define the magnetic coupler 44.

In some embodiments, the bottom door 34 includes alignment structures 52, such as protrusions 54, that engage complementary alignment structures 56, such as notches 58, on the cassette 36. The bottom door 34, in the depicted embodiment, also includes a centering structure 62 that projects in an upward direction 60 (i.e., in a direction of the z-axis of the r-θ-z coordinate system of FIG. 1A) from the mounting face 33 of the bottom door 34. In the depicted embodiment, the centering structure 62 is a centering ring 64 having an inner diameter 66 that defines an opening 68 through the mounting face 33 of the cover plate 35.

Functionally, the magnetic coupler 44 maintains registration of the cassette 36 against the mounting face 33 of the bottom door 34 with sufficient force to retain the cassette 36 during normal handling of the bottom opening pod 30 during normal handling in a manufacturing environment, such as a clean room. The alignment structures 52, 56 provide orientation of the cassette 36 when magnetically coupled to the bottom door 34. The centering structure 62 can be dimensioned to mate with a recess 72 (FIGS. 3 and 6) defined on a mounting face 74 of a base plate 76 of the cassette 36.

In various embodiments, the cassette 36 is mounted manually to the bottom door 34. The cassette 36 is gripped proximate a top end 78 and suspended over the bottom door 34 so that the magnetic coupling element 38 of the cassette 36 is in approximate alignment with the magnetic coupling element 42 of the bottom door 34. The cassette 36 is rotated about its central axis 37 into the proper alignment, and lowered onto the bottom door 34 so that the magnetic coupling elements 38 and 42 are magnetically coupled, thereby defining a magnetic coupler 44. Various embodiments, discussed below, include ways to aid in centering and keying the rotational alignment of the cassette 36.

In one embodiment, the retention forces generated by the magnetic coupler 44 is sufficient to retain the cassette 36 in place during site handling of the contents of the bottom opening pod 30, for example, during transfer and robotic manipulation in a clean room environment. A non-limiting range of retention forces generated by the magnetic coupler is in the range from 1 pound-force (lbf) to 60 lbf inclusive. (Herein, a range that is said to be "inclusive" includes the endpoint values of the stated range.) In some embodiments, the retention forces are in the range from 1 lbf to 20 lbf inclusive. In some embodiments, the retention forces are in the range from 5 lbf to 20 lbf inclusive. In some embodiments, the retention forces are in the range from 10 lbf to 20 lbf inclusive.

The retention forces can be overcome, for example, by the applying a lateral release force F (FIG. 1A) near the top of the cassette 36. The mechanical advantage provided by the height of the cassette 36 enables the release force F to be substantially less than the retention forces generated by the magnetic coupler 44. In some embodiments, the required release force F can be further reduced by tilting the bottom door 34 in the direction of the release, thereby utilizing the forces of gravity to aid in release of the cassette 36.

For embodiments where both magnetic elements 38 and 42 are magnetized, the magnetic elements 38 and 42 can be configured to be self-aligning. For example, the (magnetized) magnetic element 38 of the cassette 36 can be configured to have opposing north and south (N and S) poles in that lie on a lateral plane (i.e., on an r-θ plane of the r-θ-z coordinate system of FIG. 1A). The (magnetized) magnetic element 42 of the bottom door 34 is also configured in this way, but arranged so that, when the cassette 36 and the bottom door 34 are in proper alignment, the magnetic element 42 is oriented 180 degrees relative to the magnetic element 38. This arrangement is depicted in FIG. 6, which depicts the opposing N and S poles in alignment.

Functionally, such an arrangement will create a rotational biasing force when the magnetic elements 38 and 42 are proximate each other (such as during mounting of the cassette 36 to the bottom door 34) and the opposing N and S poles of the magnetic elements 38 and 42 are not in alignment. The rotational bias will effectively cease when the opposing N and S poles of the magnetic elements 38 and 42 become aligned. Accordingly, this arrangement can assist operating personnel or a robotic manipulator in orienting the cassette 36 on the bottom door 34.

Referring to FIGS. 3 through 6, the magnetic elements 38 and 42 are included as part of a permanent magnet assembly 80 according to an embodiment of the disclosure. In various embodiments, a base plate 76a of a cassette 36a includes a stepped orifice structure 82, the base plate 76a having a mounting face 74a. Herein, cassettes, base plates, and mounting faces are referred to collectively or generically as cassette(s) 36, base plate(s) 76, and mounting faces 74, with cassettes, base plates, and mounting faces of particular construction being referred to by the numerical references 36, 76, and 74, respectively, followed by a letter suffix (e.g., cassette 36a, base plate 76a and mounting face 74a).

The stepped orifice structure of the base plate 76a defines a first bore 84 and first shoulder 86, and a second bore 88 and second shoulder 92, the second bore 88 being of smaller diameter than the first bore 84. The stepped orifice 82 further defines a third bore 94 that may define an opening 95 on the mounting face 74a. The opening 95 may be shaped and dimensioned to accept the centering structure 62 of the bottom door 34. In one embodiment, the opening 95 defines a diameter 96 dimensioned to accept the centering ring 64.

While the figures depict the various magnetic elements as being exposed on the mounting faces 33 and 74, embodiments where the magnetic elements are not exposed are also contemplated. The magnetic elements can still provide coupling through the cover plate 33 and base plate 76 if the material through which the coupling is made is non-magnetic. For example, cover plates 33 and base plates 76 made of aluminum, stainless steel, or various polymer materials enable the magnetic coupling 46 therethrough.

In the depicted embodiment, a permanent magnet 102 is disposed in the stepped orifice 82 and is seated on the second shoulder 92. The third bore 94 cooperates with the permanent magnet to define the recess 72. A plug or retainer cover 104 is inserted into the stepped orifice 82 to capture the permanent magnet 102 within the second bore. The retainer cover 104 can be coupled to the first bore 84 and/or the first shoulder 86 in a variety of ways available to the artisan, such as a press fit, bonding, welding, threadable engagement, or with fasteners. In the depicted embodiment, the stepped orifice 82 is arranged so that the permanent magnet 102 is in close proximity to the mounting face 74a of the base plate 76a.

In various embodiments, a cover plate 35a of the bottom door 34 can also define a stepped orifice 108 for housing a permanent magnet 106. In one embodiment, the stepped orifice 108 includes the same characteristics and attributes as the stepped orifice 82, which are depicted in FIG. 6 with same-numbered numerical references. Also, the stepped orifice 108 of FIG. 6 is in an inverted orientation with respect to the stepped orifice 82, so that the permanent magnet 106 is in close proximity to a mounting face 33a of the cover plate 35a. By locating the permanent magnets 102 and 106 in close proximity to the respective mounting faces 74a and 33a, the strength of the magnetic coupler 44 is enhanced. Herein, cover plates and their mounting faces are referred to collectively or generically as cover plate(s) 35 and mounting faces 33, with cover plates and mounting faces of particular construction being referred to by the numerical references 35 and 33, respectively, followed by a letter suffix (e.g., cover plate 35a with mounting plate 33a).

Referring to FIGS. 7 through 9, details of the cassette 36a are depicted according to an embodiment of the disclosure. In the depicted embodiment, the cassette 36a includes the base plate 76a, opposing side frames 122, and cross members 124 at the top of the cassette 36a. A plurality of mounting features 126 are disposed on the side frames 122, projecting toward the interior of the cassette 36a. A plurality of retention features 128 are also disposed on the side frames 122, one for each of the plurality of mounting features 126 and also projecting toward the interior of the cassette 36a.

In various embodiments, the mounting features 126 include a mounting portion 132 and a tapered or lead-in portion 134. In the depicted embodiment, the mounting portion 132 is cylindrical, defining an upper edge 136, and the lead-in portion 134 is frusto-conical, defining a tapered surface 138 that extends from a larger diameter base 142 at the side frame 122 to a smaller diameter junction 144 at the junction between the lead-in portion 134 and the mounting portion 132.

For the depicted embodiment, the mounting features 126 are arranged in groups of four. An example group of four is identified as mounting features 126a, 126b, 126c, and 126d in FIG. 7. Each of the mounting features 126a-126d of a given group of four is mounted to the side frames 122 so that the upper edges 136 of each of the mounting portions 132 of the mounting features 126a-126d lie on a plane 146 to within a tight tolerance. The number of mounting features 126 in a given group is not limited to four; for example, a group of three mounting features 126 is also contemplated (affecting a tripod-type contact with the resident stored item 40) or groupings of more than four.

Each retention feature 128 is arranged on the side frames 122 between a respective mounting feature 126 and an outer edge 148 of the side frame 122. Each retention feature 128 is also positioned to extend in the upward direction 60 through the plane 146. In one embodiment, the mounting and retention features 126, 128 are separate items that are mounted to the side frames 122 using techniques available to the artisan, including but not limited to press fitting or threadable engagement. Unitary features are also contemplated, wherein the mounting and retention features 126 and 128 are unitary. Embodiments wherein the mounting and retention are integrally formed with the side frames are also contemplated, such as by a molding process or by machining of the features and side frames from a common block.

In operation, the stored items 40 are disposed on the mounting portion 132 of the mounting features 126. The planar relationship of the upper edges 136 of the mounting features 126a-126d provides a planar registration of the stored item 40 residing on the mounting features 126a-126d. In various embodiments, the lateral distance between junctions 144 on opposing frames 122 is dimensioned to provide a close fit between the junctions 144 and the stored item 40, to limit movement of the stored item 40 in a lateral direction 152. The tapered surface 138 of the mounting features 126 can act as guides for directing the stored item 40 onto the mounting portion 132 and lateral centering between the junctions 144 of the respective mounting features 126a-126d. The retention features 128, extending up into the plane 146, limit the shifting of the stored item 40 in a forward/aft direction 154.

Candidate materials of construction for the bottom door 34 and housing 32 include, but are not limited to, high density polyethylene, (HDPE), polycarbonate, polyethylene terephthalate (e.g., PET, PETE, or PETG), acrylonitrile butadiene styrene (ABS), as well as metals such as aluminum and injection molded metals. In one embodiment, the side frames 122 comprise forged aluminum with polyvinylidene difluoride (PVDF) features 126,128.

Figure 10:
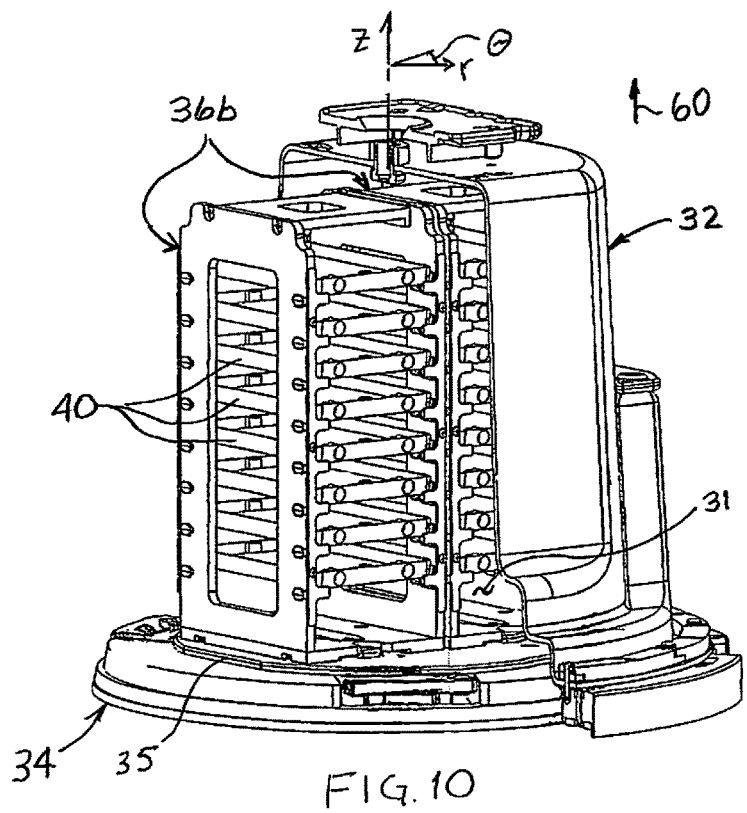
FIG. 10 is a perspective, cutaway view of a bottom opening pod having dual magnetic couplings mounted to a bottom door with loaded cassettes mounted thereto according to an embodiment of the disclosure.
Figure 11:
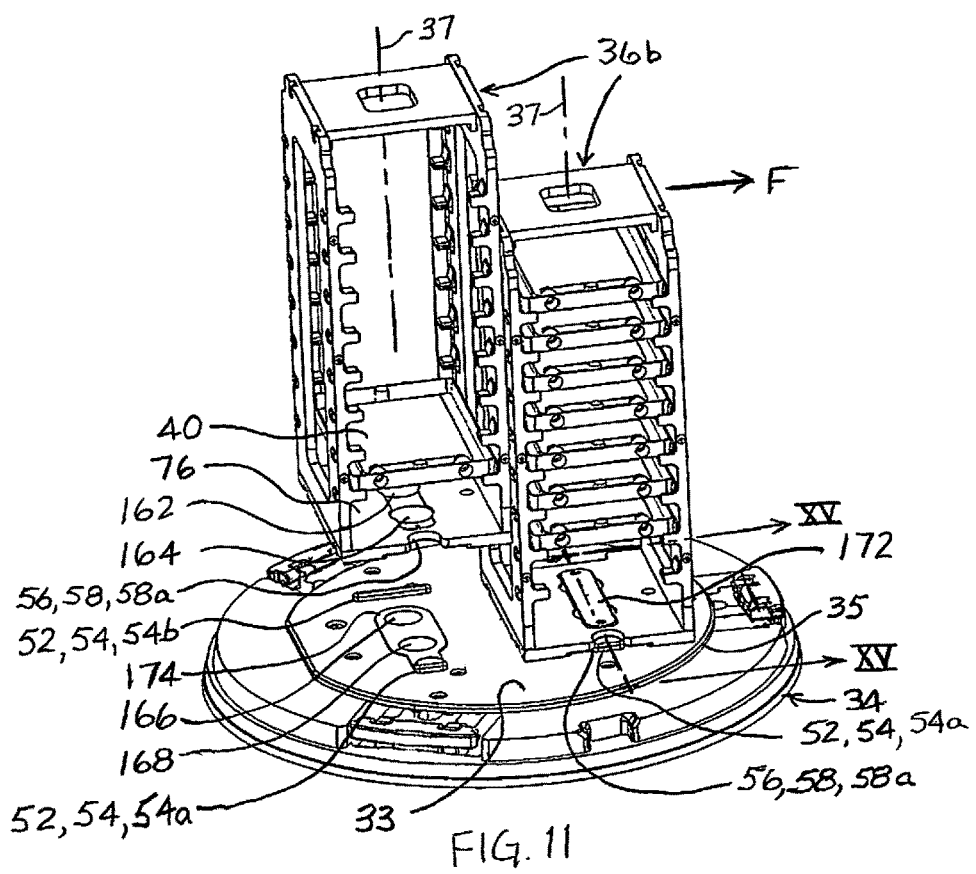
FIG. 11 is a perspective view of cassettes partially assembled within the bottom opening pod of FIG. 10 according to an embodiment of the disclosure.

Referring to FIGS. 10 and 11, cassettes 36b are presented that include dual or twin magnetic elements 162 and 164 mounted thereon according to an embodiment of the disclosure. Each of the magnetic elements 162 and 164 may be configured and mounted onto the cassette 36b in the same manner as the magnetic element 38 described attendant to FIGS. 4 and 5. Likewise, a cover plate 35b of the bottom door 34 can provide the magnetic coupling 46 with the magnetic elements 162 and 164 as discussed above, including reciprocal dual magnetic elements 166 and 168. In the depicted embodiment, the magnetic elements 162 and 164 are retained within a base plate 76b with a single retainer cover 172 that covers both magnetic elements 162 and 164.

Referring to FIGS. 12 through 16, structural details of the cover plate 35b and mounting face 33b of the bottom door 34 for accommodating the cassettes 36b are depicted according to an embodiment of the disclosure. In some embodiments, the alignment structures 52 are of different shapes, effectively keying the cassette 36b to be oriented in a single rotational orientation and preventing mounting of the cassette in the wrong orientation within the chamber 31. In the depicted embodiment, a first of the alignment structures 52 is a protrusion 54a having a semicircular foot print and cross section for mating with a substantially semi-circular notch 58a. A second of the alignment structures 52 is a protrusion 54b having an elongated, substantially rectangular foot print and cross section for mating with an elongated, rectangular notch 58b.

In various embodiments, the cover plate 35b includes raised faces 174. A pair of openings 176 may be defined on each of the raised faces 174, exposing the dual magnetic elements 166 and 168. In the depicted embodiment, stepped orifice structures 182 are defined beneath each raised face 174, akin to the stepped orifice structures 108 of FIG. 6, and accessible from a back face 180 of the cover plate 35b. The stepped orifice structures 182 are detailed in FIGS. 15 and 16. The stepped orifice structure 182 includes a first bore 184 that defines an elongate slot 178 and a first shoulder 186. The elongate slot 178 extends beneath both openings 176 of a given raised face 174. Each stepped orifice structure 182 further defines a second bore 188, a second shoulder 192, and a third bore 194 that defines the opening 176.

A pair of retainer covers 190, one for each elongate slot 178, are shaped and dimensioned to fit within the respective elongate slot 178. The first shoulder 186 of the stepped orifice structure 182 may define threaded holes 196 for threaded engagement with fasteners 198. Each retainer cover 190 may define through holes 199 (e.g., countersink holes) dimensioned to accommodate the fasteners 198 and positioned to align with the threaded holes 196 for coupling the retainer cover 190 within the respective elongate slot 178.

Functionally, as compared to the single magnetic element 42 of the cover plate 35a, the dual magnetic elements 162 and 164 of the base plate 76b and the dual magnetic elements 166 and 168 of the cover plate 35b provide enhanced magnetic coupling between the cassette 36b and the bottom door 34. Also, the dual magnetic elements 162, 164, 166, and 168 can enhance the directional mounting characteristics when directional magnetic elements are implemented so that the alignment structures 52 and 56 become redundant and, in some embodiments, can be eliminated. The raised face 174 provides an increased thickness of material for accommodating the buildup of the stepped orifice structure 182, magnetic elements 166, 168, and the retainer cover 190.

The protrusions 54a and 54b and their complementary notches 58a and 58b are dimensioned and positioned so that the protrusions 54a and 54b so that the cassettes 36b register against the mounting face 33b of the cover plate 35b only if properly oriented. That is, that the protrusions 54a and 54b interfere with the notches 58a and 58b if a given cassette 36b is improperly oriented (e.g., rotated 180 degrees) to prevent the cassettes 36b from resting on the mounting face 33b of the cover plate 35b in an improper orientation.

Figure 15:
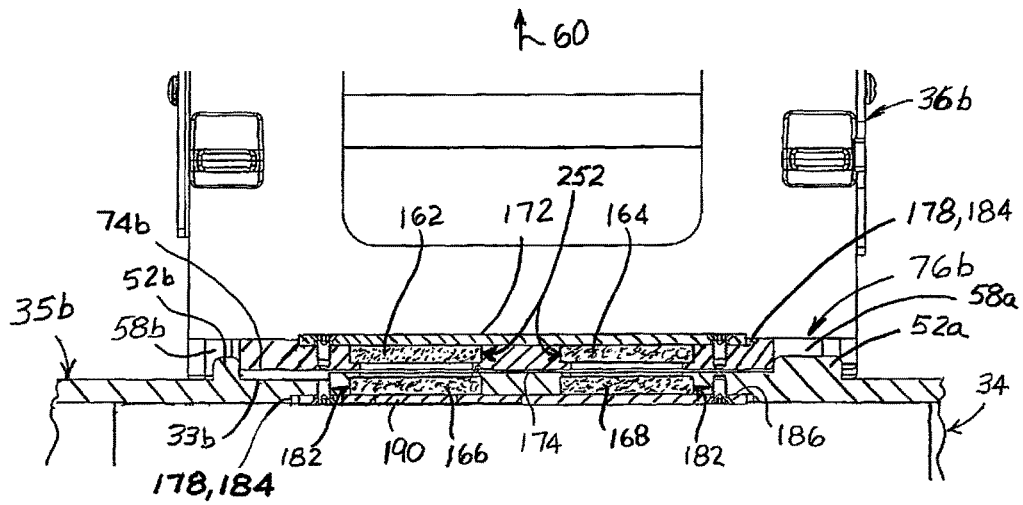
FIG. 15 is a partial sectional view of FIG. 11 along line XV-XV according to an embodiment of the disclosure.
Figure 16:
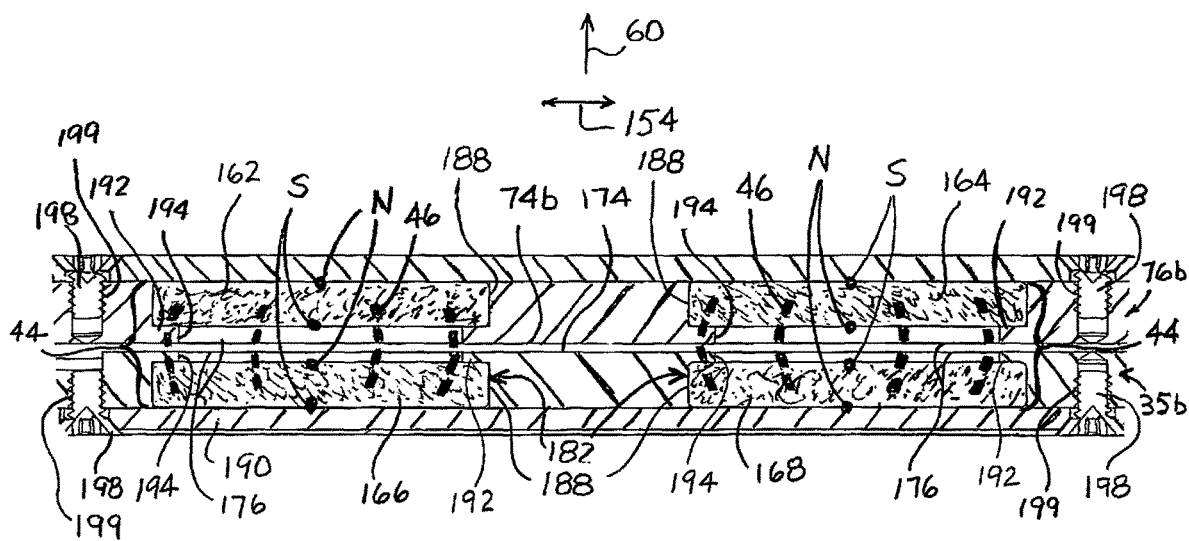
FIG. 16 is an enlarged, partial sectional view of FIG. 15.

Referring to FIGS. 17 through 21 and again to FIGS. 15 and 16, the base plate 76b is depicted according to an embodiment of the disclosure. FIGS. 17 through 19 are a three-way orthographic projection of the base plate 76b. The base plate 76b includes a body 220 having an interior face 222, so-named because it faces the interior of the cassette 36b. Opposite the interior face 222 is a mounting face 74b configured to interface the mounting face 33b of the cover plate 35b. The body 220 includes a perimeter 224 that defines the notches 58a and 58b for mating with the protrusions 54a and 54b of the cover plate 35b. In various embodiments, a plurality of counter-bores 226 are defined proximate opposing sides 232 and 234 of the perimeter 224. In one embodiment, at least some of the counter-bores 226 define an elongate through slot 228.

In some embodiments, the mounting face 74b of the base plate 76b defines a central recess 242 having a recessed face 244. A pair of openings 246 may be defined on the recessed face 244, exposing the magnetic elements 162 and 164. In the depicted embodiment, stepped orifice structures 252 are defined beneath each recessed face 244, akin to the stepped orifice structures 182 of FIG. 13, and accessible from the interior face 222 of the base plate 76b. The stepped orifice structures 252 are detailed in FIG. 16, and may include the same components and attributes as the stepped orifice structure 182, which are indicated with same-numbered numerical references. That is, the stepped orifice structures 252 includes a first bore 184 defining an elongate slot 178 and a first shoulder 186. The elongate slot 178 extends over both openings 246 of the recessed face 244. The stepped orifice structure 252 further defines a second bore 188, a second shoulder 192, and a third bore 194 that defines the opening 246. In the depicted embodiment, the elongate slot 178 accommodates the retainer cover 172. Like the stepped orifice structures 182, the first shoulder 186 of the stepped orifice structure 252 may define threaded holes 196 for threaded engagement with fasteners 198, and may define through holes 199 (e.g., countersink holes) dimensioned to accommodate the fasteners 198 and positioned to align with the threaded holes 196 for coupling the retainer cover 190 within the respective elongate slot 178.

Functionally, central recess 244 accommodates the raised face 174 of the cover plate 35b. In some embodiments, the raised face 174 acts as the centering structure 62, cooperating with the central recess 244 to laterally center the cassette 36b. The counter bores 226 enable fastening of the side frames 122 of the cassette 36 without interference of the fastener head between the mounting faces 33 and 74b. The elongate slots 228 enable fastener positioning to accommodate misalignment between the side frames 122 and the base plate 76b.

As depicted in FIG. 16, in various embodiments, the magnetic elements 162, 164, 166, and 168 are arranged so that the magnetic elements attract each other only if the cassette is in a proper orientation. In the depicted embodiment, the magnetic elements 162, 164, 166, and 168 are configured for axial polarization, i.e., so that the north and south poles N and S spaced parallel to the upward direction 60 (i.e., parallel to the z-axis of the r-θ-z coordinate system of FIG. 10). The magnetic elements 162 and 166 are mounted with their respective north poles N are facing in the upward direction 60, so that the north pole N of magnetic element 166 is adjacent the south pole S of magnetic element 162 when the cassette 36b is in the proper orientation. In contrast, the magnetic elements 164 and 168 are mounted with their respective south poles S are facing in the upward direction 60, so that the south pole S of magnetic element 168 is adjacent the north pole N of magnetic element 164 when the cassette 36b is in the proper orientation.

Functionally, the alignment of the opposite poles N and S when the cassette 36b is in the proper orientation causes the cassette 36b to be magnetically coupled to the cover plate 35b. Should the cassette 36b become rotated 180 degrees, the same-polarity surfaces become aligned adjacent each other (i.e., the south poles S of the magnetic elements 162 and 168 and the north poles N of the magnetic elements 164 and 166), thus causing a repulsion force between the cassette 36b and the cover plate 35b rather than a magnetic coupling. By this arrangement, the cassette 36b and the cover plate 35b may be magnetically keyed for proper alignment in the fore/aft direction 154. The magnetic keying arrangement may be implemented instead of or in addition to the keying arrangement provided by the alignment structures 52 and 56 of different shaped protrusions 54a, 54b and complementary notches 58a and 58b of FIG. 12.

Figures 22, 23:
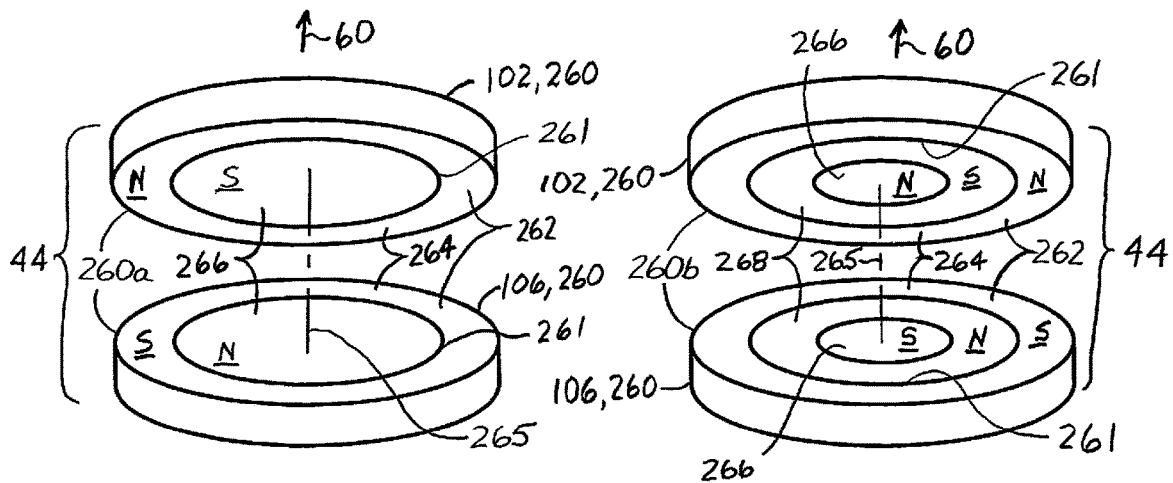
FIG. 22 is a schematic view of a magnetic coupler implementing coded magnets having concentric circular patterns defining an outer annular region and a core region according to an embodiment of the disclosure.
FIG. 23 is a schematic view of a magnetic coupler implementing coded magnets having concentric circular patterns defining an outer annular region, an intermediate annular region, and a core region according to an embodiment of the disclosure.
Figure 24:
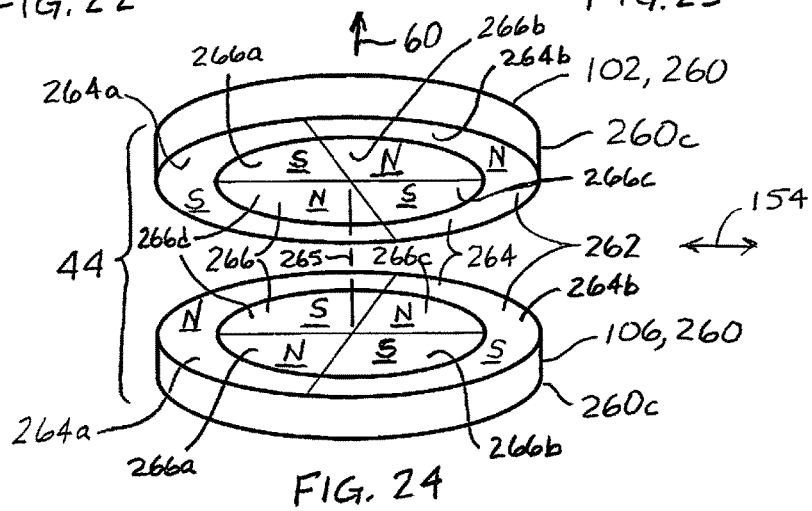
FIG. 24 is a schematic view of a magnetic coupler implementing coded magnets having semi annular outer regions and a core region divided into quadrants in according to an embodiment of the disclosure.

Referring to FIGS. 22 through 24, coded or correlated magnetic elements 260 that present a plurality of north and south polarities N and S on coupling faces 262 thereof and can be substituted for the permanent magnets 102 and 106 of FIG. 6 are presented according to embodiments of the disclosure. Herein, a "coupling face" 262 refers to the face of the magnetic element 260 that is closest to the other of the magnetic elements of a magnetic coupler 44. The coded magnetic elements are referred to collectively or generically herein as coded magnetic elements 260, with coded magnetic elements of particular construction being referred to by numerical reference 260 followed by a letter suffix (e.g., coded magnetic element 260a). Such coded or correlated magnetic elements 260 are described at U.S. Pat. No. 8,395,467 to Fullerton et al., and at http://www.amazingmagnets.com/c-160-aling-polymagnets.aspx (last visited on Mar. 14, 2016), the disclosures of which are hereby incorporated by reference herein except for express definitions and patent claims contained therein. The relevant content of at http://www.amazingmagnets.com/c-160-aling-polymagnets.aspx is included as an Appendix to this patent application. Such magnets are commercially available, for example as centering POLYMAGNETS®, manufactured by Correlated Magnetics Research, LLC, of Huntsville, Ala., U.S.A.

The coded magnetic elements 260a of FIG. 22 presents a concentric circular pattern 261 that includes an outer annular region 264 surrounding a central core region 266. For a first of the coded magnets 260a (e.g., as permanent magnet 102 of FIG. 6), the outer annular region 264 presents a north polarity N on the respective coupling face 262, and the central core region 266 presents a south polarity S on the respective coupling face 262. For a second of the coded magnets 260a (e.g., as permanent magnet 106 of FIG. 6), the outer annular region 264 presents a south polarity S on the respective coupling face 262, and the central core region 266 presents a north polarity N on the respective coupling face 262.

The coded magnetic elements 260b of FIG. 23 include the outer annular region 264, the central core region 266, and an intermediate annular region 268 between the outer annular and core regions 264 and 266. For the first of the coded magnets 260b (e.g., as permanent magnet 102 of FIG. 6), the outer annular region 264 presents a north polarity N on the respective coupling face 262, the central intermediate annular region 268 presents a south polarity S on the respective coupling face 262, and the core region 266 presents a north polarity N on the respective coupling face 262. For the second of the coded magnets 260b (e.g., as permanent magnet 106 of FIG. 6), the outer annular region 264 presents a south polarity S on the respective coupling face 262, the central intermediate annular region 268 presents a north polarity N on the respective coupling face 262, and the core region 266 presents a south polarity S on the respective coupling face 262.

Functionally, the concentric circular patterns 261 of opposing magnetic polarities in FIGS. 22 and 23 provide centering alignment of the magnetic coupler 44. The concentric circular patterns 261 urge the magnetic elements 260a, 260b (e.g., between permanent magnets 102 and 106 of FIG. 6) into axial alignment, where the magnetic coupling will be optimized. It is noted, however, that the concentric circular patterns 261 provide no rotational alignment of the magnetic elements 260a, 260b. That is, the magnetic elements 260a, 260b can rotate about an alignment axis 265 with substantially the same magnetic coupling force. Accordingly, while the concentric circular patterns 261 assist in guiding the cassette(s) 36a to a centered position, other features (e.g., mounting structures 52 and 56) provide alignment of the cassette(s) 36a in the fore/aft directions 154.

For the coded magnetic elements 260c of FIG. 24, the respective coupling faces 262 present the outer annular region 264 that surrounds the central core region 266. In the depicted embodiment, the outer annular region 264 is divided into two semi-annular regions 264a and 264b, and the central core region 266 is divided into quadrant regions 266a, 266b, 266c, and 266d. For the first of the coded magnets 260c (e.g., as permanent magnet 102), the semi-annular region 264a presents a south polarity S, the semi-annular region 264b presents a north polarity N, the diametrically opposed quadrant regions 266a and 266c present south polarities S, and the diametrically opposed quadrant regions 266b and 266d present north polarities N on the respective coupling face 262. The second of the coded magnets 260c (e.g., as permanent magnet 106) presents a mirror image of the first of the coded magnets 260c in terms of the semi-annular and quadrant regions, but of reverse polarity. That is, for the second of the coded magnets 260c (e.g., as permanent magnet 106), the semi-annular region 264a presents a north polarity N, the semi-annular region 264b presents a south polarity S, the diametrically opposed quadrant regions 266a and 266c present north polarities N, and the diametrically opposed quadrant regions 266b and 266d present south polarities S on the respective coupling face 262.

Functionally, the combination of semi-annular and quadrant regions of the coded magnets 260c bias the cassette(s) 36a toward not only a centering of the cassette(s) 36a, but also toward a preferred orientation on the bottom door 34 with respect to the fore/aft directions 154. The quadrant regions 266a, 266b, 266c, and 266d of the coupling faces 262 generate substantially the same, maximum magnetic coupling force in either of two orientations that are 180 degrees from each other. However, the semi-annular regions 264a and 264b of the coupling faces 262 are optimized in only one of these two orientations, thereby generating a preference for the depicted orientation with respect to the fore/aft direction 154.

Figure 25:
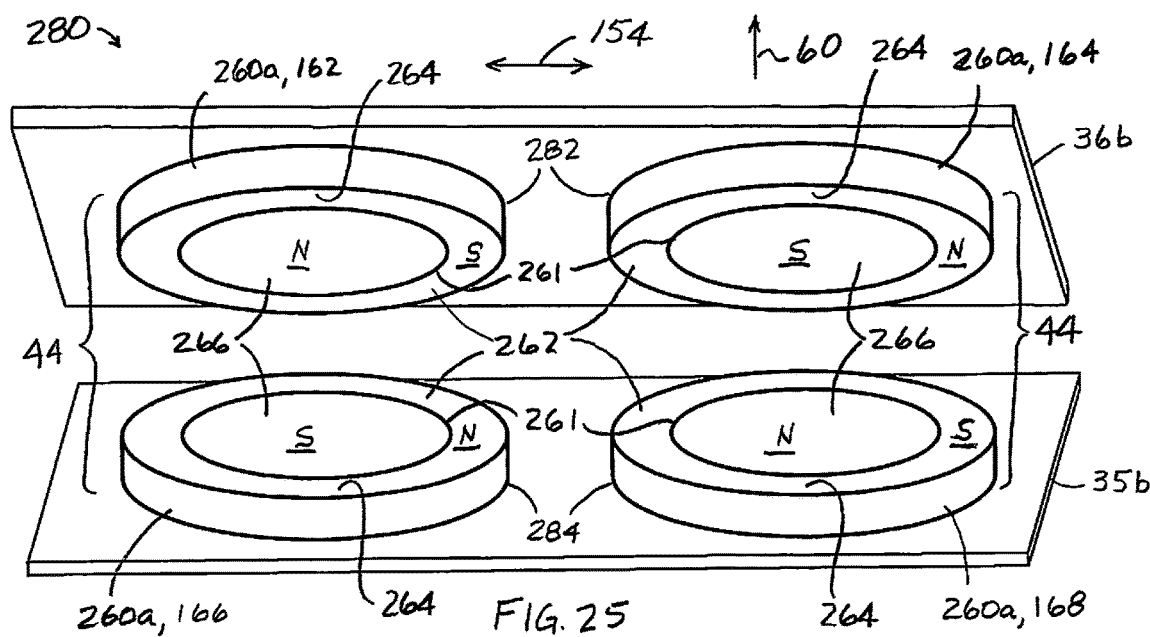
FIG. 25 is a schematic of a dual coded magnetic element configuration implementing two pairs of the coded magnets of FIG. 22 according to an embodiment of the disclosure.

Referring to FIG. 25, a dual coded magnetic element configuration 280 is depicted in an embodiment of the disclosure. In the depicted embodiment, the dual coded magnetic element configuration 280 implements two pairs 282 and 284 of magnetic elements 260a, for example as with the pairing of the dual magnetic elements 162 and 164 of the cassette 36b with the dual magnetic elements 166 and 168 of the cover plate 35b (e.g., FIG. 15). For a first of the coded magnets 260a of pair 282 (e.g., as permanent magnet 162 of FIG. 15), the outer annular region 264 presents a south polarity S on the respective coupling face 262, and the central core region 266 presents a north polarity N on the respective coupling face 262. For a second of the coded magnets 260a of pair 282 (e.g., as permanent magnet 164 of FIG. 15), the polarity is reversed, i.e., the outer annular region 264 presents a north polarity N on the respective coupling face 262, and the central core region 266 presents a south polarity S on the respective coupling face 262.

For a first of the coded magnets 260a of pair 284 (e.g., as permanent magnet 166 of FIG. 15), the outer annular region 264 presents a north polarity N on the respective coupling face 262, and the central core region 266 presents a south polarity S on the respective coupling face 262. For a second of the coded magnets 260a of pair 284 (e.g., as permanent magnet 168 of FIG. 15), the polarity is reversed, i.e., the outer annular region 264 presents a south polarity S on the respective coupling face 262, and the central core region 266 presents a north polarity N on the respective coupling face 262.

Functionally, the coded magnets 260*a* of the dual coded magnetic element configuration 280 provide the same centering function as described attendant to FIG. 22. In addition, the alignment of the opposite poles N and S of the annular regions 264 and the central core regions 266 when the pairs 282 and 284 are in the depicted orientation causes magnetic coupling of the pairs 282 and 284 to be optimized. Should the pair 282 become rotated 180 degrees with respect to the pair 284 (or vice-versa), the same-polarity surfaces of the annular and central core regions 264 and 266 become aligned adjacent each other (i.e., the south poles S of the annular regions 264 and the north poles N of the central core regions 266 of magnetic elements 162 and 168, as well as the north poles N of the annular regions 264 and the south poles S of the central core regions 266 of magnetic elements 164 and 166), thus causing a repulsion force between the pairs 282 and 284 rather than a magnetic coupling. Accordingly, the pairs 282 and 284 are effectively magnetically keyed for proper direction in the fore/aft direction 154. By implementing this arrangement into the dual magnetic coupling of FIG. 12, various embodiments of the cassette 36*b* and the cover plate 35*b* are magnetically keyed for proper alignment in the fore/aft direction 154, in addition to being centered by the concentric circular patterns 261 of the coded magnets 260*a*. Use of other coded magnets, such as the coded magnets 260*b*, are also contemplated for similar effect. The magnetic keying arrangement of FIG. 25 may be implemented instead of or in addition to the keying arrangement provided by the alignment structures 52 and 56 of different shaped protrusions 54*a*, 54*b* and complementary notches 58*a* and 58*b* of FIG. 12.

Figure 28:
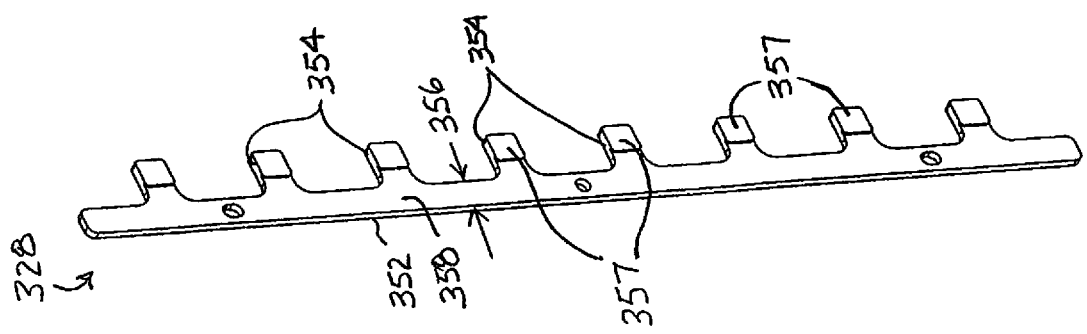
FIG. 28 is a perspective view of a forward retainer rail of the cassette of FIG. 26 according to an embodiment of the disclosure.

Referring to FIGS. 26 through 28, the cassette 36*b* is presented according to an embodiment of the disclosure. The cassette 36*b* includes the base plate 76*b* and opposing side frame assemblies 322 extending upward from the base plate 76*b*. In the depicted embodiment, the cassette 36*b* includes an upper plate 302 that bridges and separates the opposing side frame assemblies 322 at a top end 304 of the cassette 36*b*. A plurality of mounting features 326 are disposed on the side frames 122, projecting toward the interior of the cassette 36*b* for supporting stored items 40. Forward and rearward retention rails 328 and 329 are also disposed on the forward and rearward faces 330 and 331 of the side frames 122, respectively, secured thereto with fasteners 333. In the depicted embodiment, a plurality of open ended slots 340 are formed proximate to and accessible from the forward and rearward faces 330 and 331 of the side frames 122. The open ended slots 340 define a height dimension 341.

The forward retention rail 328 includes a flange portion 352 and a plurality of retention features 354 that extend from the flange portion 352. The flange portion 352 may be dimensioned to have a width 356 that is the same as the thickness of forward face 330 the side frame 122. The retention features 354 are spaced to align with the mounting features 326 proximate the forward face 330 of the respective side frame 122 of the cassette 36*b*. As depicted in FIG. 28, the retention features 354 may include pad portions 357 of increased thickness that extend from an inward face 358 of the forward retention rail 328. In the depicted embodiment, the rearward retention rails 329 define a uniform width 359 that extends inward from the rearward face 331 of the side frame 122.

Figure 30:
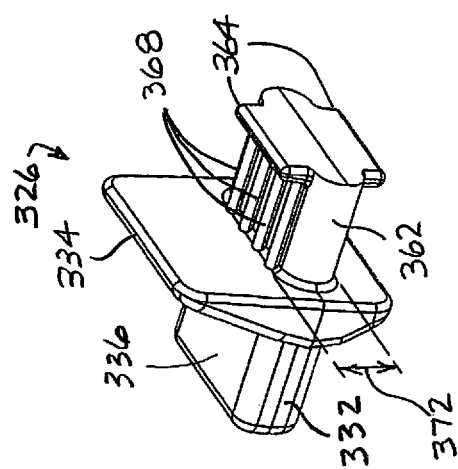
FIG. 30 is a rear, upper perspective view of the mounting feature of the cassette of FIG. 26 according to an embodiment of the disclosure.
Figure 29:
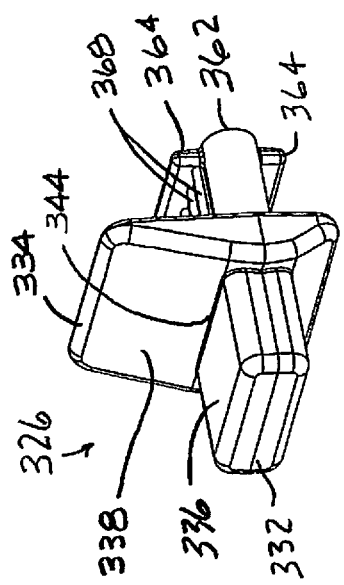
FIG. 29 is a front, upper perspective view of a mounting feature of the cassette of FIG. 26 according to an embodiment of the disclosure.
Figure 31:
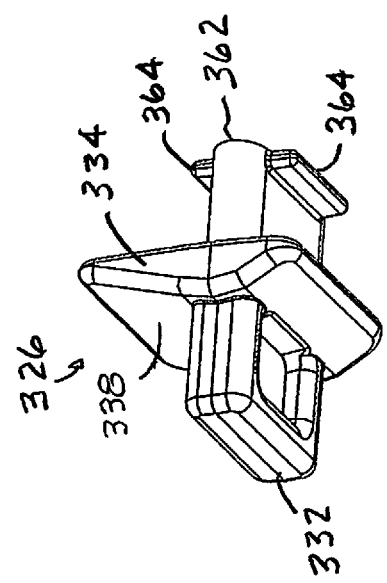
FIG. 31 is a front, lower perspective view of the mounting feature of the cassette of FIG. 26 according to an embodiment of the disclosure.

Referring to FIGS. 29 through 31, the mounting feature 326 is depicted in an embodiment of the disclosure. The mounting features 326 include a mounting portion 332 and a tapered or lead-in portion 334. In the depicted embodiment, the mounting portion 332 is rectangular or block-shaped, defining an upper face 336. The lead-in portion 334 defines a tapered surface 338 that extends inward and downward relative to the side frame 122. A junction 344 is defined between the lead-in portion 334 and the mounting portion 332. The mounting feature 326 includes a stem portion 362 that extends from the lead-in portion 334 opposite the mounting portion 332. In some embodiments, the stem portion 362 includes flange portions 364 disposed at a distal end 366. In various embodiments, a plurality of ribs 368 extend from the stem portion 362. The stem portion 362 defines a height dimension 372. The mounting features 326 may be constructed of an injection molded material, including polyvinylidene difluoride (PVDF).

As depicted in FIG. 26, the mounting features 326 are arranged in groups of four. An example group of four is identified as mounting features 326*a*, 326*b*, 326*c*, and 326*d*. Each of the mounting features 326*a*-326*d* of a given group of four is mounted to the side frames 122 so that the upper faces 336 of each of the mounting portions 332 of the mounting features 326*a*-326*d* lie on a plane 346 to within a given tolerance. The number of mounting features 326 in a given group is not limited to four; for example, a group of three mounting features 326 is also contemplated (affecting a tripod-type contact with the resident stored item 40) or groupings of more than four.

In assembly, the mounting features 326 are slid into the respective open ended slots 340. In various embodiments, the height dimension 372 of the stem portions 362 are oversized with respect to the height dimension 341 of the open ended slots 340, to provide an interference fit between the mounting feature 326 and the side frame 122. The guide portions 342 and the flange portions 364 of the stem portions 362 provide guides for insertion and lateral registration of the mounting features 326 within open ended slots 340 of the side frames 122. Alternatively or in addition, the guide portion 342 and the flange portion 364 of the stem portion 362 may be spaced apart to provide an interference fit with the thickness of the side frame 122. After installation of the mounting features 326, the forward and rearward retention rails 328 and 329 are mounted to the forward and rearward faces 330 and 331 of the side frames 122. Each retention feature 354 of the forward retention rail 328 is also positioned and dimensioned to extend in the upward direction 60 through the plane 346.

Referring to FIGS. 32 through 35, the cassette 36*b* is depicted in use according to an embodiment of the disclosure. The stored items 40 are disposed on the mounting portions 332 of the mounting features 326. The planar relationship of the upper faces 336 of the mounting features 326*a*-326*d* provides a planar registration of the stored item 40 residing on the mounting features 126*a*-126*d*. In various embodiments, a lateral distance 382 between junctions 344 of mounting features 326 on the opposing frames 122 is dimensioned to provide a close fit between the junctions 344 and the stored item 40, to limit movement of the stored item 40 in the lateral direction 152. The tapered surface 338 of the mounting features 326 can act as guides for directing the stored item 40 onto the upper face 336 of the mounting portion 332 and centering the stored item 40 laterally between the junctions 344 of the respective mounting features 126*a*-126*d*. The retention features 328, extending upwards through the plane 346, limit shifting of the stored item 40 in a forward/aft direction 154. The added thickness of the pad portions 357 may be configured to accommodate or conform to the forward face 41 of the stored item 40.

A lateral clearance 384 between the flange portions 352 of the forward retention rails 328 (FIG. 32) provides clearance for removing the stored item 40. In the depicted embodiment, the rearward retention rails 329 provide no lateral clearance sufficient for removal of the stored item 40 therethrough. Accordingly, in the depicted embodiment, removal of the stored item 40 is performed only via the forward face of the cassette 36b. It is contemplated that, for certain stored items 40, the rearward retention rails 329 may be configured the same as the forward retention rails 328, enabling access of the stored items 40 from both the forward and rearward faces 330 and 331 of the cassette 36b.

Referring to FIG. 36, a biological sample tray 400 is depicted according to an embodiment of the disclosure. The biological sample tray 400 includes a frame portion 402 and a bottom portion 406, the bottom portion 406 including a sample holding structure 406. In the depicted embodiment, the frame portion 402 defines receptacles 408 accessible from a forward face 410 of the biological sample tray 400. Also in the depicted embodiment, the frame portion 402 tapers inward toward the bottom portion 406. The biological sample tray 400 may also include foot portions 412 that depend from the frame portion 402 or the bottom portion 406 proximate the corners of the biological sample tray 400.

In operation, in various embodiments, the biological sample tray 400 (or other stored item 40) is removed from the cassette 36 by engaging the biological sample tray 400 with an end effector of a robotic manipulator. The biological sample tray 400 is elevated upward and away from mounting features 126, 326 of the cassette 36 with the robotic manipulator, so that the biological sample tray 400 is elevated higher than retention features 128, 354 of the cassette 36. The stored item may then be translated over the retention features and out of the cassette via the lateral clearance 384 between the flange portions 352 of the forward retention rails 328. The end effector may engage the receptacles 408 for the automation handling.

To insert the biological sample tray 400 (or other stored item 40) into the cassette 36, the removal process is essentially reversed. The biological sample tray 400 is engaged with an end effector of a robotic manipulator, elevating the biological sample tray 400 so that the stored item is elevated higher than the retention features 128, 354 of the cassette 36. The biological sample tray 400 is then translated over the retention features 128, 354 and into the cassette 36, and lowered so that the foot portions 412 are registered on the mounting the features 126, 326 of the cassette 36.

The biological sample tray 400 is one of several stored items 40 that can be utilized in the bottom opening pod 30. Other forms of stored items 40 that may be used in the disclosed bottom opening pod 30 include substrates for the semiconductor industry, as well as hazardous material receptacles.

Each of the additional figures and methods disclosed herein can be used separately, or in conjunction with other features and methods, to provide improved devices and methods for making and using the same. Therefore, combinations of features and methods disclosed herein may not be necessary to practice the disclosure in its broadest sense and are instead disclosed merely to particularly describe representative embodiments.

Various modifications to the embodiments may be apparent to one of skill in the art upon reading this disclosure. For example, persons of ordinary skill in the relevant arts will recognize that the various features described for the different embodiments can be suitably combined, un-combined, and re-combined with other features, alone, or in different combinations. Likewise, the various features described above should all be regarded as example embodiments, rather than limitations to the scope or spirit of the disclosure.

Persons of ordinary skill in the relevant arts will recognize that various embodiments can comprise fewer features than illustrated in any individual embodiment described above. The embodiments described herein are not meant to be an exhaustive presentation of the ways in which the various features may be combined. Accordingly, the embodiments are not mutually exclusive combinations of features; rather, the claims can comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

References to "embodiment(s)", "disclosure", "present disclosure", "embodiment(s) of the disclosure", "disclosed embodiment(s)", and the like contained herein refer to the specification (text, including the claims, and figures) of this patent application that are not admitted prior art.

For purposes of interpreting the claims, it is expressly intended that the provisions of 35 U.S.C. 112(f) are not to be invoked unless the specific terms "means for" or "step for" are recited in the respective claim.

What is claimed is:

1. A bottom opening pod, comprising:
  a bottom door;
  a housing that cooperates with the bottom door to define an interior chamber, wherein the bottom door is received in a door opening defined in a bottom of the housing;
  a first cassette disposed in the interior chamber and mounted to an upper surface of the bottom door; and
  a first magnetic coupler adapted to magnetically couple the first cassette to the bottom door, wherein the first magnetic coupler includes a first coded magnet mounted on a bottom surface the first cassette and a second coded magnet mounted on the upper surface of the bottom door and wherein the first and second coded magnets are magnetically keyed for centering and biasing the first cassette in a preferred rotational orientation with respect to the bottom door.

2. The bottom opening pod of claim 1, wherein the first magnetic coupler includes a permanent magnet.

3. The bottom opening pod of claim 1, wherein the first cassette and the bottom door include complementary mating structures for rotational alignment of the first cassette on the bottom door.

4. The bottom opening pod of claim 3, wherein the complimentary mating structures are configured to align the first cassette in a single rotational orientation.

5. The bottom opening pod of claim 1, wherein the bottom opening pod is a standard mechanical interface pod.

6. The bottom opening pod of claim 1, comprising a second cassette and including a second magnetic coupler for magnetically coupling the second cassette to the bottom door.

7. The bottom opening pod of claim 1, comprising a second magnetic coupler adapted to magnetically couple the first cassette to the bottom door.

8. The bottom opening pod of claim 7, wherein the second magnetic coupler includes a permanent magnet.

9. The bottom opening pod of claim 7, wherein:
the first magnetic coupler includes a first permanent magnet mounted on the first cassette and a second permanent magnet mounted on the bottom door; and
the second magnetic coupler includes a third permanent magnet mounted on the first cassette and a fourth permanent magnet mounted on the bottom door.

10. The bottom opening pod of claim 9, wherein the first permanent magnet and the second permanent magnet cooperate with and the third permanent magnet and the fourth permanent magnet to bias the first cassette toward a rotational alignment with respect to the bottom door.

11. The bottom opening pod of claim 10, wherein:
the first permanent magnet and the second permanent magnet are coded magnets configured to center with each other; and
the third permanent magnet and the fourth permanent magnet are coded magnets configured to center with each other.

12. The bottom opening pod of claim 11, wherein the coded magnets are magnetically keyed for biasing the first cassette in a preferred rotational orientation with respect to the bottom door.

13. The bottom opening pod of claim 10, wherein a coupling face of the first permanent magnet is configured to repel a coupling face of the third permanent magnet, such that a repulsion force is generated between the first cassette and the bottom door when the first permanent magnet is aligned with the third permanent magnet.

14. The bottom opening pod of claim 13, wherein a coupling face of the second permanent magnet is configured to repel a coupling face of the fourth permanent magnet, such that a repulsion force is generated between the first cassette and the bottom door when the second permanent magnet is aligned with the fourth permanent magnet.

15. The bottom opening pod of claim 7, wherein:
the first cassette and the bottom door include complementary mating structures for rotational alignment of the first cassette on the bottom door; and
the second cassette and the bottom door include complementary mating structures for rotational alignment of the second cassette on the bottom door.

16. The bottom opening pod of claim 1, comprising a circular seal member disposed between the housing and the bottom door.

* * * * *